United States Patent
Kim et al.

(10) Patent No.: US 11,353,999 B2
(45) Date of Patent: Jun. 7, 2022

(54) ELECTRONIC DEVICE

(71) Applicant: Samsung Display Co., LTD., Yongin-si (KR)

(72) Inventors: Il-Joo Kim, Hwaseong-si (KR); Deokjung Kim, Busan (KR); Wonjun Choi, Seoul (KR); Youngbae Jung, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/136,679

(22) Filed: Dec. 29, 2020

(65) Prior Publication Data

US 2021/0365146 A1 Nov. 25, 2021

(30) Foreign Application Priority Data

May 22, 2020 (KR) .......................... 10-2020-0061696

(51) Int. Cl.
*G06F 3/044* (2006.01)
*H01L 27/32* (2006.01)
*G02B 5/30* (2006.01)

(52) U.S. Cl.
CPC .......... *G06F 3/0443* (2019.05); *G06F 3/0446* (2019.05); *H01L 27/323* (2013.01); *G02B 5/3025* (2013.01)

(58) Field of Classification Search
CPC ... G06F 3/0443; G06F 3/0446; H01L 27/323; H01L 51/5275; G02B 5/3025
See application file for complete search history.

(56) References Cited

U.S. PATENT DOCUMENTS

| 6,846,579 | B2 * | 1/2005 | Anderson | G06F 3/0412 |
| | | | | 428/212 |
| 7,554,051 | B2 * | 6/2009 | Crispin | H01H 13/703 |
| | | | | 200/5 A |
| 9,224,981 | B2 * | 12/2015 | Kang | H01L 51/5253 |
| 9,608,049 | B2 * | 3/2017 | Lee | H01L 51/0097 |

(Continued)

FOREIGN PATENT DOCUMENTS

| KR | 10-2015-0077831 | 7/2015 |
| KR | 10-2018-0005323 | 1/2018 |

(Continued)

*Primary Examiner* — Amy Onyekaba
(74) *Attorney, Agent, or Firm* — Kile Park Reed & Houtteman PLLC

(57) ABSTRACT

Provided is an electronic device including a display element layer, an encapsulation layer, a sensor layer including a sensing electrode disposed in an active area, and a sensing line disposed in the line area, electrically connected with the sensing electrode, and extending in a first direction, and a high refraction layer disposed on the sensor layer. The sensor layer further includes a first conductive layer disposed on the encapsulation layer, a second conductive layer disposed on the first conductive layer, an inorganic insulation layer disposed between the first conductive layer and the second conductive layer, and an organic insulation layer disposed between the second conductive layer and the high refraction layer. In the line area, at least one opening is defined in the organic insulation layer, the at least one opening extending in a second direction, and the inorganic insulation layer is exposed by the at least one opening.

20 Claims, 15 Drawing Sheets

(56) References Cited

U.S. PATENT DOCUMENTS

| | | | |
|---|---|---|---|
| 10,224,377 B2* | 3/2019 | Park | H01L 27/3246 |
| 10,541,380 B1* | 1/2020 | Sung | H01L 51/0097 |
| 10,553,827 B2* | 2/2020 | Jang | G06F 3/044 |
| 10,847,751 B2* | 11/2020 | Lee | H01L 51/5246 |
| 2004/0119403 A1* | 6/2004 | McCormick | H01L 51/5203 313/506 |
| 2013/0056710 A1* | 3/2013 | Oh | H01L 51/5268 257/40 |
| 2014/0015767 A1* | 1/2014 | Hsieh | G06F 3/0445 345/173 |
| 2014/0145979 A1* | 5/2014 | Lee | H01L 51/5281 345/173 |
| 2014/0204043 A1* | 7/2014 | Lin | G06F 3/04164 345/173 |
| 2014/0218642 A1* | 8/2014 | Iwami | H05K 3/12 349/12 |
| 2016/0109852 A1* | 4/2016 | Kuwabara | G04G 17/045 368/223 |
| 2016/0162060 A1* | 6/2016 | Hong | G06F 3/0446 428/201 |
| 2016/0299611 A1* | 10/2016 | Park | G06F 3/04164 |
| 2016/0320885 A1* | 11/2016 | Kim | G06F 3/0443 |
| 2017/0229668 A1* | 8/2017 | Stapleton | H01B 1/124 |
| 2017/0277288 A1* | 9/2017 | Choi | G06F 3/0412 |
| 2017/0373270 A1* | 12/2017 | Kim | H01L 27/3262 |
| 2018/0039360 A1* | 2/2018 | Akimoto | H01L 27/3276 |
| 2018/0061898 A1* | 3/2018 | Oh | G06F 3/0412 |
| 2018/0136769 A1* | 5/2018 | Naganuma | G06F 3/0448 |
| 2018/0159081 A1* | 6/2018 | Choi | G06F 3/0412 |
| 2018/0196564 A1* | 7/2018 | Lin | H01L 25/167 |
| 2018/0308903 A1* | 10/2018 | Jeong | G06F 3/0445 |
| 2018/0348913 A1* | 12/2018 | Lee | G06F 3/0412 |
| 2019/0004654 A1 | 1/2019 | Gwon et al. | |
| 2019/0012031 A1* | 1/2019 | Kim | H01L 51/5203 |
| 2019/0036063 A1* | 1/2019 | Lee | H01L 51/524 |
| 2019/0074339 A1* | 3/2019 | Ma | H01L 27/3246 |
| 2019/0097171 A1* | 3/2019 | Park | H01L 51/0097 |
| 2019/0115395 A1* | 4/2019 | Lee | H01L 27/323 |
| 2019/0198782 A1* | 6/2019 | Kim | H01L 27/1248 |
| 2019/0221779 A1* | 7/2019 | Jang | H01L 27/3246 |
| 2019/0288047 A1* | 9/2019 | Jeong | H01L 51/5256 |
| 2020/0006697 A1* | 1/2020 | Jung | H01L 51/5243 |
| 2020/0091247 A1* | 3/2020 | Lee | H01L 27/323 |
| 2020/0159369 A1* | 5/2020 | Seo | H01L 27/3276 |
| 2020/0168670 A1* | 5/2020 | Kim | H01L 27/3211 |
| 2020/0321552 A1* | 10/2020 | Oh | H01L 51/5237 |
| 2020/0350512 A1* | 11/2020 | Guo | G06F 3/0412 |
| 2020/0411596 A1* | 12/2020 | Guo | H01L 27/3258 |
| 2021/0134910 A1* | 5/2021 | Yang | H01L 51/5253 |
| 2021/0167487 A1* | 6/2021 | Varma | H01Q 25/005 |

FOREIGN PATENT DOCUMENTS

| | | |
|---|---|---|
| KR | 10-2019-0003181 | 1/2019 |
| KR | 10-2019-0086605 | 7/2019 |

* cited by examiner

ELECTRONIC DEVICE

CROSS-REFERENCE TO RELATED APPLICATIONS

This U.S. non-provisional patent application claims priority to and the benefit of Korean Patent Application No. 10-2020-0061696 under 35 U.S.C. § 119, filed in the Korean Intellectual Property Office (KIPO) on May 22, 2020, the entire contents of which are incorporated herein by reference.

BACKGROUND

The present disclosure relates to an electronic device including a sensor layer.

An electronic device includes an active area that is activated by an electrical signal. The electronic device may sense an input applied from the outside through the active area and simultaneously display various images to provide information to a user.

The electronic device may include various elements such as a display element, a touch element, or a detection element, which are activated by an electronic signal. Also, a structure including optical functional layers on the display element and a method for forming the optical functional layers have been developed in order to improve display quality of the electronic device.

SUMMARY

The present disclosure provides an electronic device having improved reliability by controlling (or adjusting) a position of a high diffraction layer.

In an aspect, an embodiment provides an electronic device including an active area and a line area disposed adjacent to the active area, the electronic device including a display element layer; an encapsulation layer disposed on the display element layer; a sensor layer including a sensing electrode disposed in the active area; and a sensing line disposed in the line area, electrically connected with the sensing electrode, and extending in a first direction; and a high refraction layer disposed on the sensor layer. The sensor layer may further include a first conductive layer disposed on the encapsulation layer; a second conductive layer disposed on the first conductive layer; an inorganic insulation layer disposed between the first conductive layer and the second conductive layer; and an organic insulation layer disposed between the second conductive layer and the high refraction layer. In the line area, at least one opening may be defined in the organic insulation layer, the at least one opening extending in a second direction different from the first direction, and the inorganic insulation layer is exposed by the at least one opening of the organic insulation layer.

In an embodiment, a plurality of the contact holes may be defined in the inorganic insulation layer, and the plurality of the contact holes may include a first contact hole and a second contact hole defined at a side and another side of the at least one opening of the organic insulation layer, respectively.

In an embodiment, the first conductive layer and the second conductive layer may be electrically connected to each other through the first contact hole and the second contact hole of the plurality of contact holes.

In an embodiment, the first contact hole and the second contact hole of the plurality of contact holes may be filled by the second conductive layer.

In an embodiment, the first contact hole and the second contact hole of the plurality of contact holes may overlap the organic insulation layer and may not overlap the high refraction layer.

In an embodiment, the first direction may extend from the active area to the line area, and the second direction may be perpendicular to the first direction.

In an embodiment, the electronic device may further include a plurality of dam parts disposed in the line area and surrounding at least a portion of the active area. The plurality of dam parts may be disposed adjacent to the active area and may not overlap the at least one opening of the organic insulation layer.

In an embodiment, the line area may include a first part disposed adjacent to the active area where the plurality of dam parts are disposed; a second part overlapping the at least one opening of the organic insulation layer; and a third part disposed between the first part and the second part. The inorganic insulation layer, the organic insulation layer, and the high refraction layer may overlap each other in the first part of the line area, the inorganic insulation layer may not overlap the organic insulation layer and the high refraction layer in the second part of the line area, and the inorganic insulation layer may overlap the organic insulation layer and may not overlap the high refraction layer in the third part of the line area.

In an embodiment, the first conductive layer, the inorganic insulation layer, the second conductive layer, the organic insulation layer, and the high refraction layer may be sequentially formed in the first part of the line area, the first conductive layer and the inorganic insulation layer may be formed in the second part of the line area, and the first conductive layer, the inorganic insulation layer, the second conductive layer, and the organic insulation layer may be sequentially formed in the third part of the line area.

In an embodiment, the electronic device may further include an adhesive layer disposed on the high refraction layer, and a polarizer layer disposed on the adhesive layer. The adhesive layer may contact the high refraction layer in the first part of the line area, the adhesive layer may contact the exposed inorganic insulation layer in the second part of the line area, and the adhesive layer may contact the organic insulation layer in the third part of the line area.

In an embodiment, the at least one opening of the organic insulation layer may include a bottom portion defined by the exposed inorganic insulation layer, and a side portion defined by the organic insulation layer overlapping the second conductive layer. An inclined angle of the side portion with respect to the bottom portion may be in a range from about 100° to about 110°.

In an embodiment, the plurality of dam parts may include a first dam part disposed adjacent to the active area, a second dam part disposed outside the first dam part, and a third dam part disposed outside the second dam part, and the high refraction layer may have a thickness that gradually decreases in a direction from the first dam part to the third dam part.

In an embodiment, an edge of the high refraction layer may overlap the third dam part in a plan view.

In an embodiment, the high refraction layer may have a refractive index equal to or greater than about 1.6.

In an embodiment, the electronic device may further include a plurality of sub-protruding parts spaced apart from each other in the at least one opening of the inorganic insulation layer.

In an embodiment, the plurality of sub-protruding parts and the organic insulation layer may include a same material.

In another aspect, an electronic device including an active area, a line area disposed adjacent to the active area, and a pad area spaced apart from the active area and disposed adjacent to the line area, may include a display element layer; an encapsulation layer disposed on the display element layer; a sensor layer including a sensing electrode disposed in the active area; and a sensing line disposed in the line area, electrically connected with the sensing electrode, and extending in a first direction; and a high refraction layer disposed on the sensor layer. The sensor layer may further include a first conductive layer disposed on the encapsulation layer; a second conductive layer disposed on the first conductive layer; an inorganic insulation layer disposed between the first conductive layer and the second conductive layer; and an organic insulation layer disposed between the second conductive layer and the high refraction layer. In the line area, a first opening and a second opening, each of which extends in a second direction different from the first direction, may be defined in the organic insulation layer, the second opening may be disposed closer to the pad area than the first opening, and a first contact hole is defined in the inorganic insulation layer in the line area at a side of the first opening adjacent to the active area, and a second contact hole is defined in the inorganic insulation layer at a side of the second opening adjacent to the pad area.

In an embodiment, the second direction may be perpendicular to the first direction, and each of the first opening and the second opening may have a stripe shape extending in the second direction in a plan view.

In an embodiment, the electronic device may further include an adhesive layer disposed on the high refraction layer and filling the first opening of the organic insulation layer, and a polarizer layer disposed on the adhesive layer.

In an embodiment, the adhesive layer may contact the inorganic insulation layer exposed by the first contact hole or the second contact hole, and may not contact the second conductive layer.

BRIEF DESCRIPTION OF THE DRAWINGS

An additional appreciation according to the embodiments of the invention will become more apparent by describing in detail the embodiments thereof with reference to the accompanying drawings, wherein.

DETAILED DESCRIPTION OF THE EMBODIMENTS

Figure 1:
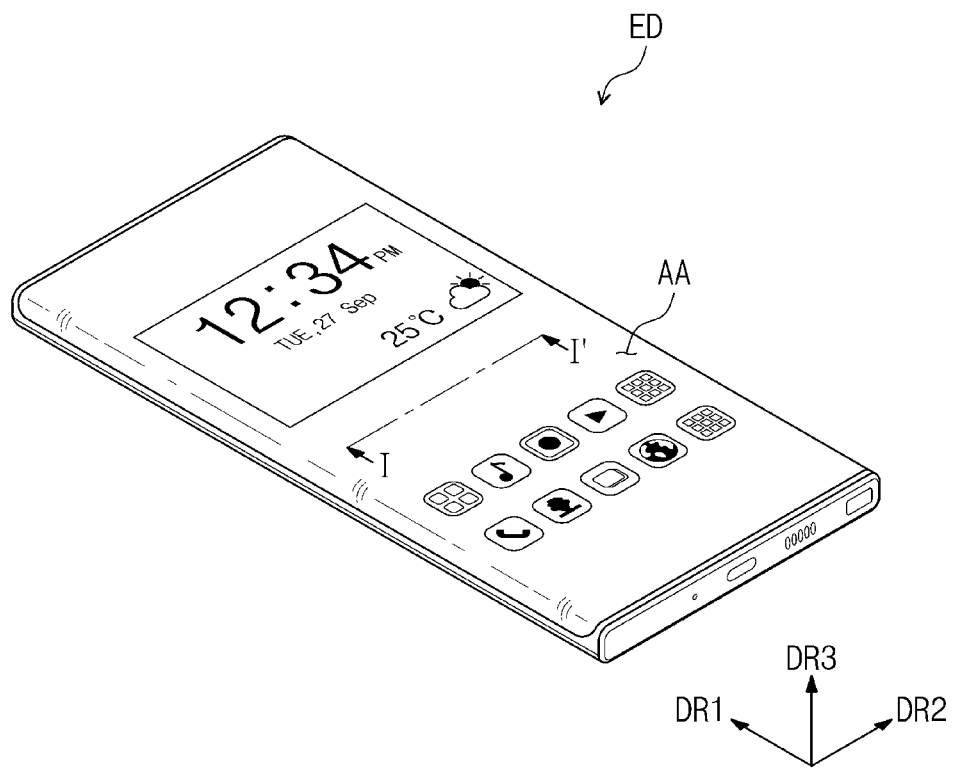
FIG. 1 is a schematic perspective view illustrating an electronic device according to an embodiment.

Since the present disclosure may have diverse modified embodiments, preferred embodiments are illustrated in the drawings and are described in the detailed description of the invention. However, this does not limit the present disclosure within specific embodiments and it should be understood that the present disclosure covers all the modifications, equivalents, and replacements within the idea and technical scope of the invention.

In this specification, it will also be understood that when one component (or region, layer, portion) is referred to as being "on," "connected to," or "coupled to" another component, it can be directly disposed on, or connected or coupled to the one component, or an intervening third component may also be present.

In this application, it will be understood that when a layer, a film, a region, or a plate "directly contacts" another layer, film, region, or plate, there is no another layer, film, region, or plate present therebetween. For example, if a layer is "directly disposed" on another layer, the layer may be disposed on the another layer without using an additional member such as an adhesive member.

Like reference numerals refer to like elements throughout. Also, in the figures, the thickness, ratio, and dimensions of components may be exaggerated for clarity of illustration.

The term "and/or" includes any and all combinations of one or more of the associated listed items.

It will be understood that although the terms such as "first" and "second" are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

The terms "under," "below," "above," "upper," and the like are used for explaining relation association of components illustrated in the drawings. The terms may be a relative concept and described based on directions illustrated in the drawings. It will also be understood that when an element or layer is referred to as being "on" another one, it can be disposed on the upper portion or the lower portion of another one.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

It will be further understood that the terms "comprise," "include," "have," and the like, when used in this specification, specify the presence of stated features, integers, steps, operations, elements, components, and/or combinations of them but do not preclude the presence or addition of one or more other features, integers, steps, operations, elements, components, and/or combinations thereof.

In the specification and the claims, the phrase "at least one of" is intended to include the meaning of "at least one selected from the group of" for the purpose of its meaning and interpretation. For example, "at least one of A and B" may be understood to mean "A, B, or A and B."

Hereinafter, an electronic device according to an embodiment of the disclosure will be described with reference to the accompanying drawings.

Figure 2:
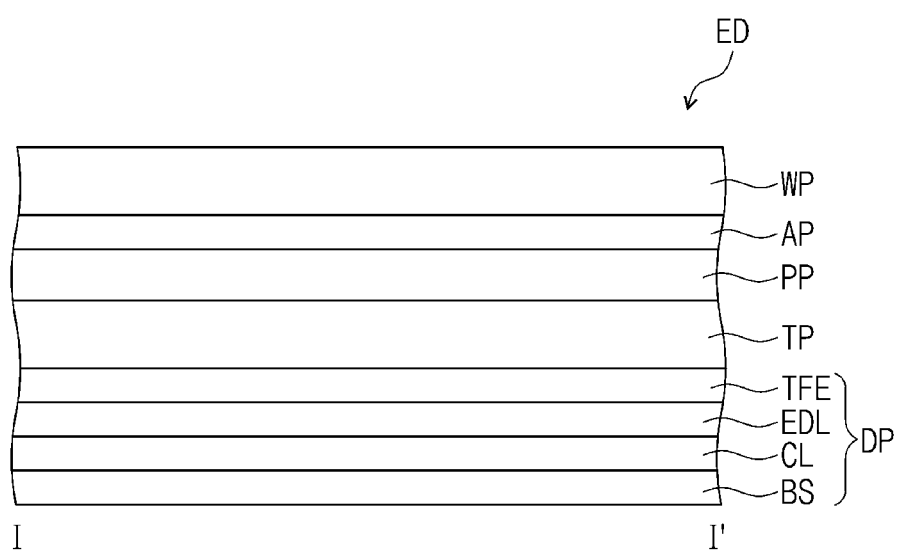
FIG. 2 is a schematic cross-sectional view illustrating the electronic device according to an embodiment.
Figure 2:
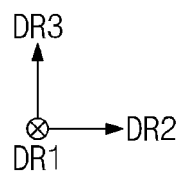

FIG. 1 is a schematic perspective view illustrating an electronic device according to an embodiment. FIG. 2 is a schematic cross-sectional view taken along line I-I' of FIG. 1. Referring to FIGS. 1 and 2, an electronic device ED according to an embodiment may be activated by an electrical signal. Although the electronic device ED may be, e.g., a mobile phone, a tablet computer, a navigation unit for a vehicle, a game console, or a wearable device, the embodiments are not limited thereto. FIG. 1 exemplarily illustrates that the electronic device ED is a mobile phone.

The electronic device ED may display an image through an active area AA. The active area AA may include a flat surface defined by (or parallel to) a first directional axis DR1 and a second directional axis DR2. The active area AA may further include a curved surface extending from at least one side of the flat surface defined by (or parallel to) the first directional axis DR1 and the second directional axis DR2. The electronic device ED according to an embodiment in FIG. 1 includes two curved surfaces extending from both side surfaces of the flat surface defined by (or parallel to) the first directional axis DR1 and the second directional axis DR2, respectively. However, the embodiments are not limited to the shape of the active area AA illustrated. For example, the active area AA may include only the flat surface or may further include at least two curved surfaces, e.g., four curved surfaces extending from four side surfaces of the flat surface, respectively.

Although the first to third directional axes DR1, DR2, and DR3 are illustrated in FIG. 1 and drawings below, directions indicated by the first to third directional axes DR1, DR2, and DR3 reflect relative concepts and may be interchanged. The directions indicated by the first to third directional axes DR1, DR2, and DR3 may be referred to as first to third directions and may be designated by the same reference numerals, i.e., DR1, DR2, and DR3.

In this specification, the first directional axis DR1 and the second directional axis DR2 are perpendicular to each other, and the third directional axis DR3 is a normal direction with respect to a plane defined by the first and second directional axes DR1 and DR2.

A thickness direction of the electronic device ED may be parallel to the third directional axis DR3 that is a normal direction with respect to the plane defined by the first directional axis DR1 and the second directional axis DR2. In this specification, a front surface (or top surface) and a rear surface (or bottom surface) of members of the electronic device ED may be defined based on the third directional axis DR3.

As shown in FIG. 2, the electronic device ED may include a display layer DP and a sensor layer TP disposed on the display layer DP. The electronic device ED may further include an optical layer PP disposed on the sensor layer TP. The electronic device ED may further include a window WP disposed on the sensor layer TP. The window WP may be disposed on the optical layer PP, and an adhesive member AP may be disposed between the optical layer PP and the window WP.

The display layer DP may include a base layer BS, a circuit layer CL disposed on the base layer BS, a display element layer EDL disposed on the circuit layer CL, and an encapsulation layer TFE disposed on the display element layer EDL. The encapsulation layer TFE may cover or overlap the display element layer EDL.

The base layer BS may be a member providing a base surface on which the display element layer EDL is disposed. The base layer BS may be a glass substrate, a metal substrate, a polymer substrate, or the like. However, the embodiments are not limited thereto. For example, the base layer BS may be an inorganic layer, an organic layer, or a composite material layer.

The base layer BS may have a multilayer structure. For example, the base layer BS may have a three-layer structure of a synthetic resin layer, an adhesive layer, and a synthetic resin layer. Particularly, the synthetic resin layer may include a polyimide-based resin. The synthetic resin layer may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a parylene-based resin. In this specification, the term "X-based" resin represents a feature of including a functional group of "X."

The circuit layer CL may be disposed on a base layer BS. The circuit layer CL may include an insulation layer, a semiconductor pattern, a conductive pattern, and a signal line. The insulation layer, the semiconductor pattern, and the conductive pattern may be provided by a method such as coating and deposition, and then the insulation layer, the semiconductor pattern, and the conductive pattern may be selectively patterned through a photolithography process. Thereafter, the semiconductor pattern, the conductive pattern, and the signal line, which are included in the circuit layer CL, may be provided.

The display element layer EDL may be disposed on the circuit layer CL. The display element layer EDL may include a light emitting element. For example, the display element layer EDL may include an organic light emitting element, a quantum dot light emitting element, a micro-LED light emitting element, or a nano-LED light emitting element.

The encapsulation layer TFE may be disposed on the display element layer EDL. The encapsulation layer TFE may include at least one organic layer and at least one inorganic layer. For example, the encapsulation layer TFE may include an inorganic layer, an organic layer, and an inorganic layer, which are sequentially laminated (or formed). However, the embodiments are not limited to the above-described layers included in the encapsulation layer TFE.

The sensor layer TP may be disposed on the display layer DP. The sensor layer TP may sense an external input applied from the outside. The external input may be an input of a user. For example, the input of the user may include external inputs of various types such as a portion of a user's body, light, heat, a pen, or pressure.

The sensor layer TP may be provided on the display layer DP through a continuous process. In one embodiment, the sensor layer TP may be directly disposed on the display layer DP. The feature of being directly disposed may mean that a third component is not disposed between the sensor layer TP and the display layer DP. For example, a separate adhesion member may not be disposed between the sensor layer TP and the display layer DP. As another example, the sensor layer TP may be directly disposed on the encapsulation layer TFE.

However, the embodiments are not limited thereto. For example, an adhesive member (not shown) may be further disposed between the sensor layer TP and the display layer DP.

The optical layer PP may be disposed on the sensor layer TP. The optical layer PP may include at least one of optical functional layers such as a light path control layer changing a light path or an anti-reflection layer reducing a reflectance of external light incident from the outside. For example, the optical layer PP may be a polarizing plate in the electronic device ED according to an embodiment.

The window WP may be disposed on the optical layer PP. The window WP may correspond to an uppermost layer of the electronic device ED. The window WP may be a tempered glass substrate that is reinforced. The window WP may have a tempered surface to stably protect the sensor layer TP and the display layer DP from an external impact. The window WP according to an embodiment may further include a printing layer (not shown) disposed at an inside or outside edge. For example, the printing layer (not shown) may correspond to peripheral areas NAA (refer to FIG. 5).

The adhesive member AP may be further disposed between the window WP and the optical layer PP. The adhesive member AP may include an optically clear adhesive layer.

Figure 3:
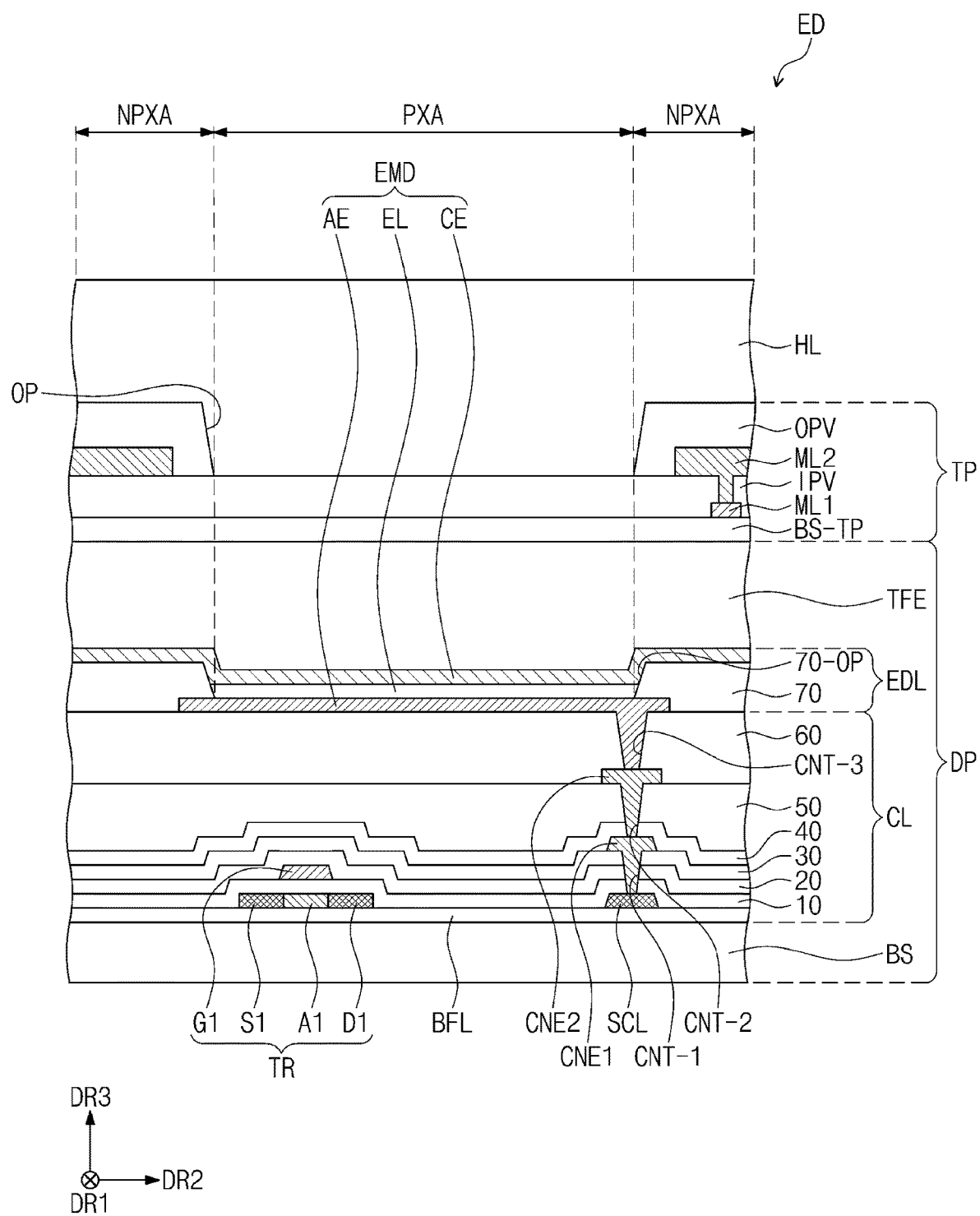
FIG. 3 is a schematic cross-sectional view illustrating the electronic device according to an embodiment.

FIG. 3 is a schematic cross-sectional view illustrating the electronic device according to an embodiment. FIG. 3 is a schematic cross-sectional view corresponding to a portion of the active area AA (refer to FIG. 1) of the electronic device ED.

At least one inorganic layer is provided on a top surface of the base layer BS in the display layer DP. The inorganic layer may include at least one of an aluminum oxide, a titanium oxide, a silicon oxide, a silicon oxynitride, a zirconium oxide, and a hafnium oxide. The inorganic layer may include multiple layers. The multi-layered inorganic layers may form (or constitute) a barrier layer and/or a buffer layer. In this embodiment, the display layer DP includes a buffer layer BFL.

The buffer layer BFL may enhance a coupling force between the base layer BS and the semiconductor pattern. The buffer layer BFL may include a silicon oxide layer and a silicon nitride layer, and the silicon oxide layer and the silicon nitride layer may be alternately laminated (or formed) with each other.

The semiconductor pattern may be disposed on the buffer layer BFL. The semiconductor pattern may include polysilicon. However, the embodiments are not limited thereto. For example, the semiconductor pattern may include amorphous silicon or a metal oxide.

FIG. 3 merely illustrates a portion of the semiconductor pattern, and the semiconductor pattern may be further disposed on another area. The semiconductor pattern may be arranged over pixels based on a particular rule. The semiconductor pattern may have an electrical property that is at least in part determined by doping of the semiconductor pattern. The semiconductor pattern may include a doped area and a non-doped area. The doped area may be doped with an n-type dopant or a p-type dopant. A p-type transistor may include a doped area that is doped with the p-type dopant, and an n-type transistor may include a doped area that is doped with the n-type dopant.

The doped area may have a conductivity greater than that of the non-doped area and may substantially function as an electrode or a signal line. The non-doped area substantially corresponds to an active (or channel) of the transistor. In other words, one portion of the semiconductor pattern may be the active of the transistor, another portion may be a source or a drain of the transistor, and another portion may be a connection electrode or a connection signal line.

Each of the pixels may have an equivalent circuit including seven transistors, one capacitor, and a light emitting element, and the equivalent circuit of the pixel may be transformed into various circuits. FIG. 3 exemplarily illustrates one transistor TR and one light emitting element EMD included in the pixel.

A source S1, an active layer A1, and a drain D1 of the transistor TR may be provided from the semiconductor pattern. The source S1 and the drain D1 may extend from the active layer A1 in opposite directions in a cross-section. FIG. 3 illustrates a portion of a connection signal line SCL provided from the semiconductor pattern. Although not separately shown, the connection signal line SCL may be electrically connected to the drain D1 of the transistor TR on a plane or layer.

A first insulation layer 10 may be disposed on the buffer layer BFL. The first insulation layer 10 may overlap pixels in common and cover or overlap the semiconductor pattern. The first insulation layer 10 may be an inorganic layer and/or an organic layer and may have a single-layer or multi-layer structure. The first insulation layer 10 may include at least one of an aluminum oxide, a titanium oxide, a silicon oxide, a silicon oxynitride, a zirconium oxide, and a hafnium oxide. In an embodiment, the first insulation layer 10 may be a single-layered silicon oxide layer. In addition to the first insulation layer 10, an insulation layer of the circuit layer CL, which will be described below, may be an inorganic layer and/or an organic layer and have a single-layer or multi-layer structure. Although the inorganic layer may include at least one of the above-described materials, the embodiments are not limited thereto.

A gate G1 of the transistor TR is disposed on the first insulation layer 10. The gate G1 may be a portion of a metal pattern. The gate G1 overlaps the active layer A1. The gate G1 may function as a mask in a process of doping the semiconductor pattern.

A second insulation layer 20 may be disposed on the first insulation layer 10 to cover or overlap the gate G1. The second insulation layer 20 may overlap the pixels in common. The second insulation layer 20 may be an inorganic layer and/or an organic layer and have a single-layer or multi-layer structure. In an embodiment, the second insulation layer 20 may be (or comprise) a single-layered silicon oxide layer.

A third insulation layer 30 may be disposed on the second insulation layer 20, and in an embodiment, the third insulation layer 30 may be (or comprise) a single-layered silicon oxide layer.

A first connection electrode CNE1 may be disposed on the third insulation layer 30. The first connection electrode CNE1 may be electrically connected to the connection signal line SCL through a contact hole CNT-1 passing through the first to third insulation layers 10, 20 and 30.

A fourth insulation layer 40 may be disposed on the third insulation layer 30. The fourth insulation layer 40 may be (or comprise) a single-layered silicon oxide layer. A fifth insulation layer 50 may be disposed on the fourth insulation layer 40. The fifth insulation layer 50 may be (or comprise) an organic layer.

A second connection electrode CNE2 may be disposed on the fifth insulation layer 50. The second connection electrode CNE2 may be electrically connected to the first connection electrode CNE1 through a contact hole CNT-2 passing through the fourth insulation layer 40 and the fifth insulation layer 50.

A sixth insulation layer 60 may be disposed on the fifth insulation layer 50 to cover or overlap the second connection electrode CNE2. The sixth insulation layer 60 may be (or comprise) an organic layer.

The display element layer EDL including the light emitting element EMD may be disposed on the circuit layer CL. The light emitting element EMD may include a first electrode AE, a light emitting layer EL, and a second electrode CE.

The first electrode AE may be disposed on the sixth insulation layer 60. The first electrode AE may be electrically connected to the second connection electrode CNE2 through a contact hole CNT-3 passing through the sixth insulation layer 60.

A pixel defining layer 70 may be disposed on the sixth insulation layer 60 to overlap a portion of the first electrode AE. An opening 70-OP is defined (or formed) in the pixel defining layer 70. The opening 70-OP of the pixel defining layer 70 exposes at least a portion of the first electrode AE. In this embodiment, a light emitting area PXA may be defined as an area corresponding to a portion of the first electrode AE exposed by the opening 70-OP. A non-light emitting area NPXA may surround the light emitting area PXA.

The light emitting layer EL may be disposed on the first electrode AE. The light emitting layer EL may be disposed in the opening 70-OP. For example, the light emitting layer EL may be separately provided on each of the pixels. In case that the light emitting layer EL is separately provided in each of the pixels, each of the light emitting layers EL may emit light having at least one color of blue, red, and green. However, the embodiments are not limited thereto. For example, the light emitting layer EL may be electrically connected to the pixels and provided in common. In this case, the light emitting layer EL may provide blue light or white light. The light emitting layer EL may include an organic light emitting material or a quantum-dot material.

The second electrode layer CE may be disposed on the light emitting layer EL. The second electrode CE may have an integrated shape and be disposed on the pixels in common.

Although not shown, a hole transport region may be disposed between the first electrode AE and the light emitting layer EL. The hole transport region may be disposed in the light emitting area PXA and the non-light emitting area NPXA in common. The hole transport region may include a hole transport layer and may further include a hole injection layer. An electron transport region may be disposed between the light emitting layer EL and the second electrode CE. The electron transport region may include an electron transport layer and may further include an electron injection layer. The hole transport region and the electron transport region may be provided as a common layer on the pixels. However, the embodiments are not limited thereto. For example, the hole transport region and the electron transport region may be also patterned in correspondence to the light emitting area PXA.

The encapsulation layer TFE may be disposed on the display element layer EDL. The encapsulation layer TFE may be disposed on the second electrode CE.

The sensor layer TP may include a sensor base layer BS-TP, a first conductive layer ML1, an inorganic insulation layer IPV, a second conductive layer ML2, and an organic insulation layer OPV.

The sensor base layer BS-TP may be an inorganic layer including one of a silicon nitride, a silicon oxynitride, and a silicon oxide. As another example, the sensor base layer BS-TP may be an organic layer including an epoxy-based resin, an acrylate-based resin or an imide-based resin. The sensor base layer BS-TP may have a single-layer structure or a multi-layer structure laminated (or formed) in the third direction DR3.

Each of the first conductive layer ML1 and the second conductive layer ML2 may have a single-layer structure or a multi-layer structure laminated in the third direction DR3. The conductive layer having the single-layer structure may include a metal layer or a transparent conductive layer. The metal layer may include molybdenum, silver, titanium, copper, aluminum, and an alloy thereof. The transparent conductive layer may include a transparent conductive oxide such as an indium tin oxide (ITO), an indium zinc oxide (IZO), a zinc oxide (ZnO), and an indium zinc tin oxide (IZTO). Also, the transparent conductive layer may include a conductive polymer such as PEDOT, a metal nano-wire or graphene.

The conductive layer ML1 and ML2 having the multi-layer structure may include metal layers. For example, the metal layers may have a three-layer structure of titanium (Ti)/aluminum (Al)/titanium (Ti). The conductive layer ML1 and ML2 having the multi-layer structure may include at least one metal layer and at least one transparent conductive layer.

The second conductive layer ML2 may have a thickness greater than that of the first conductive layer ML1. For example, the second conductive layer ML2 may have a thickness which is about 1.5 times greater than that of the first conductive layer ML1. For example, the first conductive layer ML1 may have a thickness of about 1950 Å, and the second conductive layer ML2 may have a thickness of about 3100 Å. However, the embodiments are not limited to the thickness of the conductive layers. For example, in an embodiment, the first conductive layer ML1 may have a thickness equal to that of the second conductive layer ML2, and the first conductive layer ML1 may have a thickness greater than that of the second conductive layer ML2.

The inorganic insulation layer IPV may include at least one of an aluminum oxide, a titanium oxide, a silicon oxide, a silicon oxynitride, a zirconium oxide, and a hafnium oxide. The inorganic insulation layer IPV may have surface energy different from that of a high refraction layer HL, which will be described below. A high refraction resin used to make the high refraction layer HL may have a low adhesion force with the inorganic insulation layer IPV. Thus, in case that the high refraction resin is provided, the high refraction resin may not be diffused onto the inorganic insulation layer IPV.

The organic insulation layer OPV may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin. The organic insulation layer OPV may have surface energy similar to that of the high refraction layer HL. A high refraction resin used to make the high refraction layer HL may have a high adhesion force with the organic insulation layer OPV. Thus, in case that the high refraction resin is provided, the high refraction resin may be easily applied and diffused on the organic insulation layer OPV.

In an embodiment, the organic insulation layer OPV may have a thickness greater than that of the inorganic insulation layer IPV. The organic insulation layer OPV may have a thickness about five times greater than that of the inorganic insulation layer IPV. The inorganic insulation layer IPV may have a thickness of about 3000 Å, and the organic insulation layer OPV may have a thickness of about 17500 Å to about 25000 Å. However, the thickness of each of the inorganic insulation layer IPV and the organic insulation layer OPV is not limited to the above-described value.

A pixel opening OP may be defined (or formed) in a portion of the organic insulation layer OPV. The pixel opening OP may overlap the light emitting area PXA. The pixel opening OP may expose a top surface of the inorganic insulation layer IPV.

The high refraction layer HL may be disposed on the organic insulation layer OPV. The high refraction layer HL may be disposed in the pixel opening OP. The high refraction layer HL may have a refractive index greater than that of the organic insulation layer OPV. The high refraction layer HL may have a refractive index equal to or greater than about 1.6. The high refraction layer HL may include a siloxane-based resin. The high refraction layer HL may include at least one of zirconium oxide particles, aluminum oxide particles, and titanium oxide particles in addition to the siloxane-based resin. For example, the high refraction layer HL may have a refractive index equal to or greater than about 1.6 and equal to or less than about 1.75. Specifically, the high refraction layer HL may have a refractive index of about 1.7. A difference between the refractive index of the high refraction layer HL and the refractive index of the organic insulation layer OPV may be or greater than about 0.1. For example, the organic insulation layer OPV may have a refractive index of about 1.4 to about 1.55. Specifically, the organic insulation layer OPV may have a refractive index of about 1.53.

Although not shown in the drawing, an optical control layer (not shown) may be further provided below the high refraction layer HL. The optical control layer may have a refractive index that is relatively lower than that of the high refraction layer HL. For example, the optical control layer may have a refractive index of about 1.4 to about 1.55. Specifically, the optical control layer may have a refractive index of about 1.53.

For example, the high refraction layer HL in the active area AA may have a mean thickness of about 1.8 mm. The high refraction layer HL in a line area WA (refer, e.g., to FIG. 4) may have a thickness less than that of the high refraction layer HL in the active area AA.

Light emitted from the light emitting layer EL may be emitted in a side direction as well as a front direction, e.g., a direction parallel to the third directional axis DR3. An optical efficiency may be determined based on the light emitted in the front direction. Light emitting in the side direction of the electronic device according to an embodiment may be refracted or total-reflected by a difference in refractive indexes of the high refraction layer HL and a side surface of the organic insulation layer OPV, which defines the pixel opening OP. Thus, the light emitting in the side direction may have a light path that is changed in the third direction DR3 or a direction adjacent to the third direction DR3. Thus, the electronic device ED according to an embodiment including the high refraction layer HL may exhibit an improved optical efficiency property.

Figure 4:
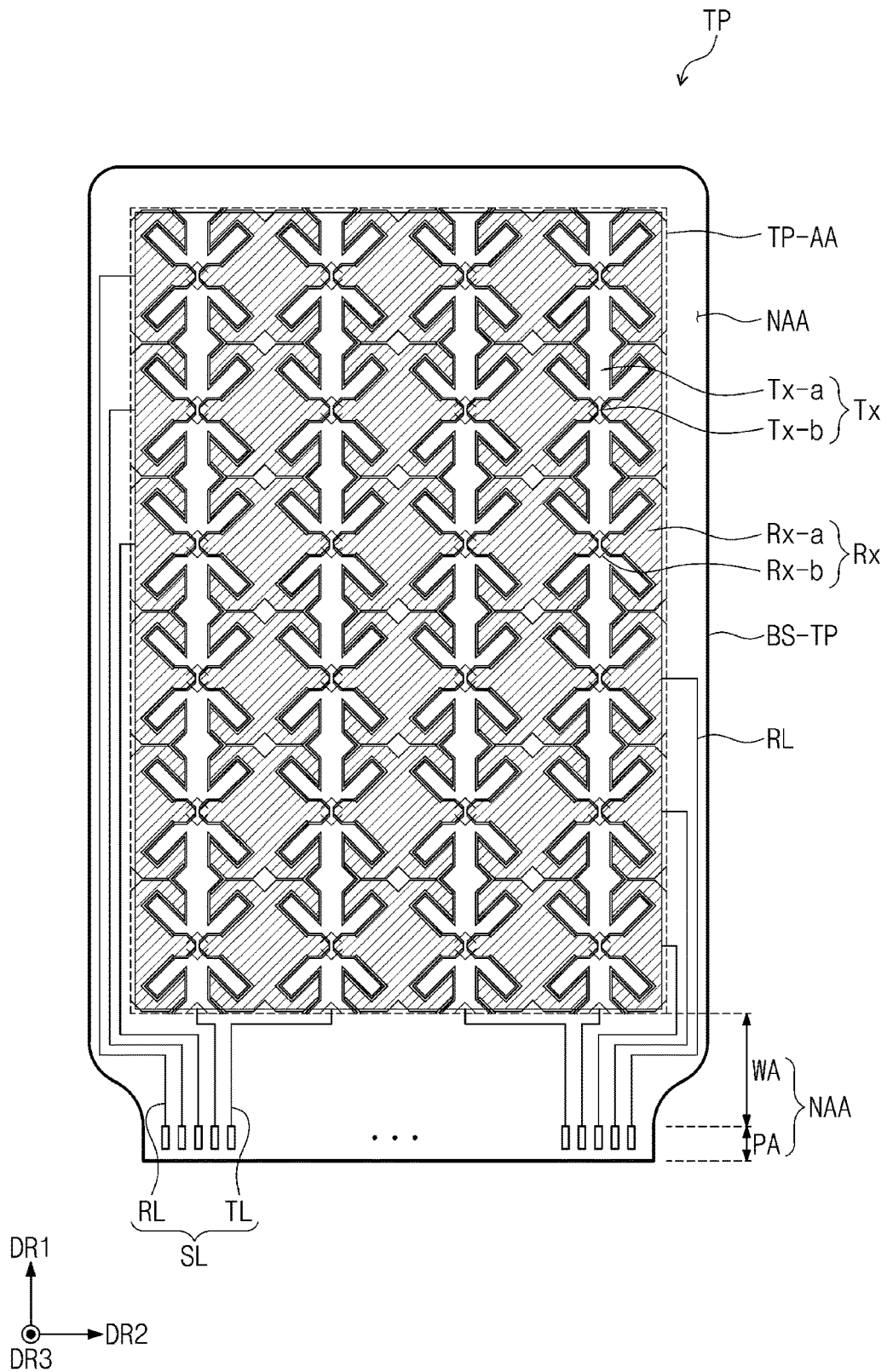
FIG. 4 is a schematic plan view illustrating a sensor layer according to an embodiment.

FIG. 4 is a schematic plan view illustrating the sensor layer according to an embodiment. The sensor layer TP may sense an external input applied from the outside. The external input may be an input of a user. For example, the input of the user may include various types of external inputs such as a portion of a user's body, light, heat, a pen, or pressure. The sensor layer TP may include a sensing area TP-AA and a peripheral area NAA. The sensing area TP-AA may be activated by an electrical signal. For example, the sensing area TP-AA may sense an input. The peripheral area NAA may surround the sensing area TP-AA. The sensing area TP-AA may correspond to the active area AA of the electronic device ED.

The sensor layer TP may include sensing electrodes Tx and Rx disposed on the sensing area TP-AA corresponding to the active area AA, and sensing lines SL extending in the first direction DR1 while being electrically connected to the sensing electrodes Tx and Rx and disposed on the line area WA. For example, the sensor layer TP may include first sensing electrodes Tx, second sensing electrodes Rx, first sensing lines TL, and second sensing lines RL.

The first sensing electrodes Tx and the second sensing electrodes Rx may be disposed on the sensing area TP-AA. The sensor layer TP may acquire information on the external input through a variation of a mutual capacitance between the first sensing electrodes Tx and the second sensing electrodes Rx.

Each of the first sensing electrodes Tx may extend in a direction parallel to the first directional axis DR1. The first sensing electrodes Tx may be spaced apart from each other in a direction parallel to the second directional axis DR2. Each of the second sensing electrodes Rx may extend in the direction parallel to the second directional axis DR2. The second sensing electrodes Rx may be spaced apart from each other in the direction parallel to the first directional axis DR1. The first sensing electrodes Tx and the second sensing electrodes Rx may intersect each other.

Each of the first sensing electrodes Tx may include first portions Tx-a and a second portion Tx-b defined between neighboring first portions Tx-a of the first portions Tx-a. The first portions Tx-a may be referred to as sensing portions, and the second portions Tx-b may be referred to as a connecting portion or a crossing portion.

The first portions Tx-a and the second portion Tx-b may be electrically connected to each other to have an integrated shape. Thus, the second portion Tx-b may be defined as a portion of the first sensing electrode Tx intersecting the second sensing electrode Rx. The first portions Tx-a and the second portion Tx-b may be disposed on the same layer.

Each of the second sensing electrodes Rx may include sensing patterns Rx-a and a bridge pattern Rx-b electrically connected to two neighboring sensing patterns Rx-a of the sensing patterns Rx-a. The sensing patterns Rx-a and the bridge pattern Rx-b may be disposed on different layers. Although two bridge patterns Rx-b connecting two sensing patterns Rx-a are exemplarily illustrated in FIG. 4, different numbers of bridge patterns Rx-b (e.g., one bridge pattern Rx-b or three bridge patterns Rx-b) may connect the sensing patterns Rx-a.

The first portions Tx-a, the second portion Tx-b, the sensing patterns Rx-a may be disposed on the same layer. The bridge pattern Rx-b, the first portions Tx-a, the second portion Tx-b, and the sensing patterns Rx-a may be disposed on a different layer. For example, the bridge pattern Rx-b may be included in the first conductive layer ML1 (refer to FIG. 3), and the first portions Tx-a, the second portion Tx-b, and sensing patterns Rx-a may be included in the second conductive layer ML2 (refer to FIG. 3). However, the embodiments are not limited thereto. For example, the bridge pattern Rx-b and the second portion Tx-b may be disposed in various manners as long as the bridge pattern Rx-b and the second portion Tx-b are disposed on different layers.

Each of the first sensing electrodes Tx and the second sensing electrodes Rx may be electrically connected to corresponding sensing line SL of the first sensing lines TL and the second sensing lines RL. For example, a first sensing electrode Tx may be connected to a sensing line TL. A second sensing electrode Rx may be electrically connected to a second sensing line RL. However, the embodiments are not limited to the illustrated connection relationship between the first or second sensing lines TL and RL to the first sensing electrodes Tx and the second sensing electrodes Rx. For example, a first sensing electrode Tx may be electrically connected to two first sensing lines TL. The first sensing electrode Tx may include an end electrically connected to the first sensing line TL and another end electrically connected to another first sensing line TL.

Here, shapes of the sensing electrodes Tx and Rx, the number of the sensing electrodes Tx and Rx and the connection relationships between the sensing lines SL in FIG. 4 are merely illustrative. However, the embodiments are not limited thereto.

Figure 5:
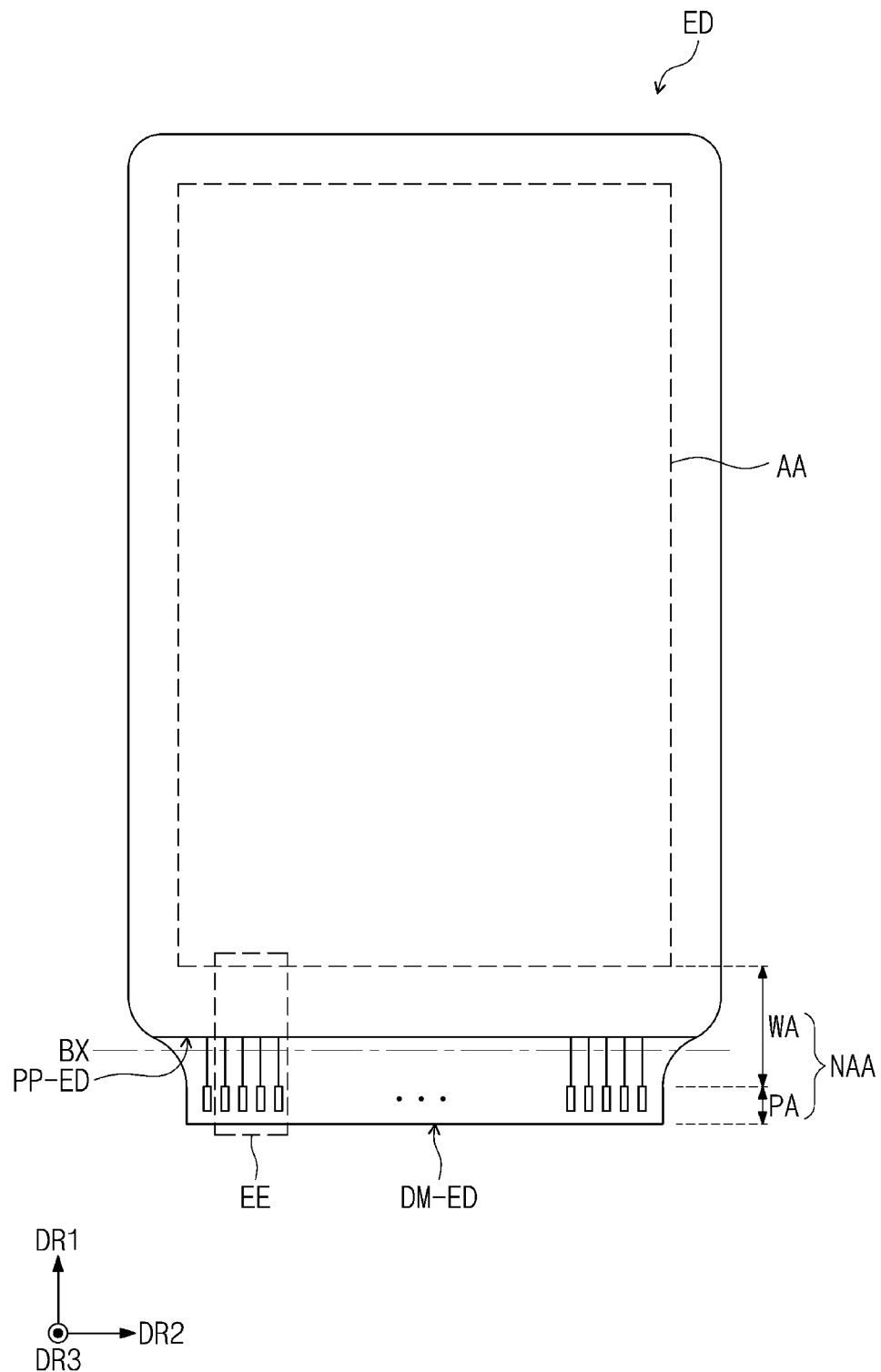
FIG. 5 is a schematic plan view illustrating the electronic device according to an embodiment.
Figure 6:
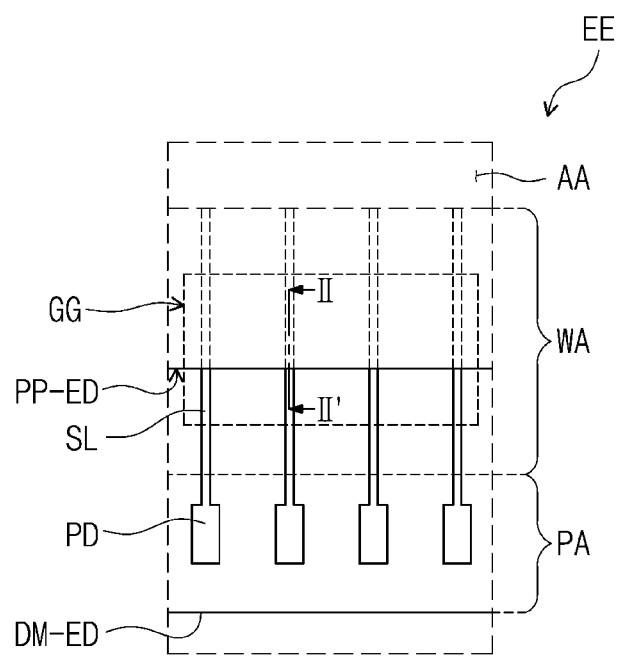
FIG. 6 is a schematic plan view illustrating a portion of the electronic device according to an embodiment.
Figure 7:
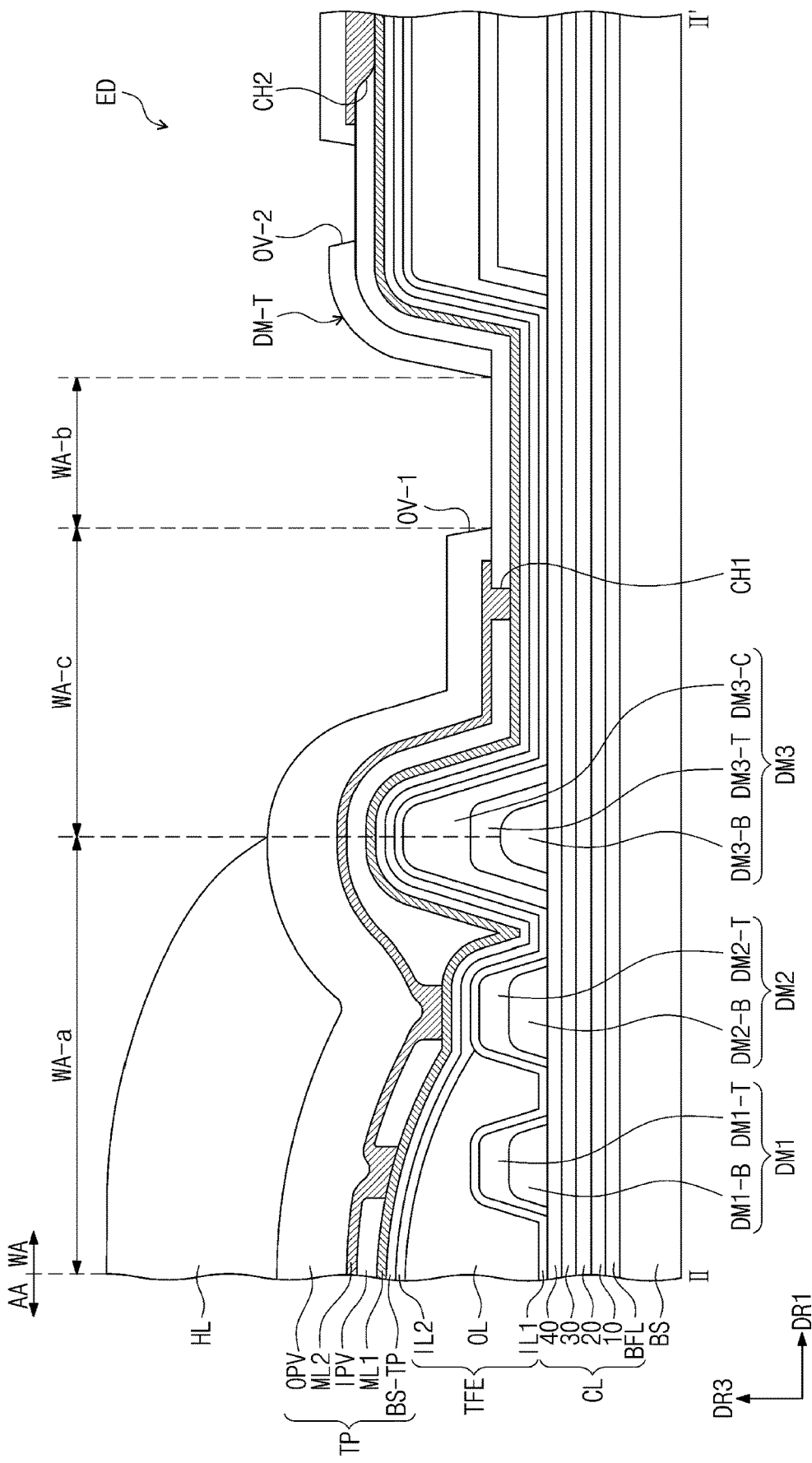
FIG. 7 is a schematic cross-sectional view illustrating a portion of the electronic device according to an embodiment.
Figure 8:
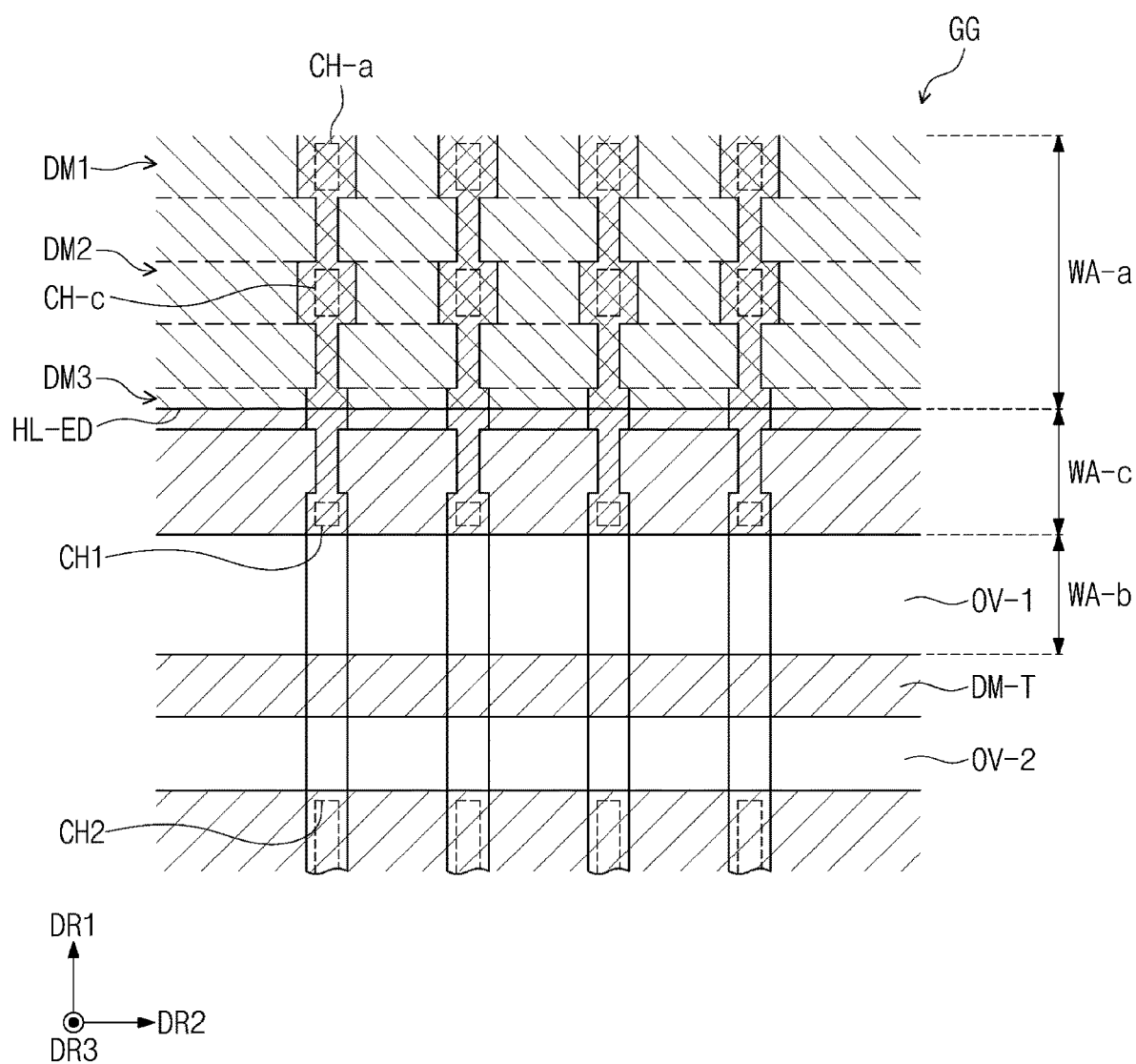
FIG. 8 is a schematic plan view illustrating a portion of the electronic device according to an embodiment.

FIG. 5 is a schematic plan view illustrating a portion of the electronic device according to an embodiment. FIG. 6 is a schematic plan view illustrating an area corresponding to portion EE of FIG. 5. FIG. 7 is a schematic cross-sectional view taken along line II-II' of FIG. 6. FIG. 8 is a schematic plan view illustrating a portion of the electronic device according to an embodiment. FIG. 8 is a plan view illustrating an area corresponding to portion GG of FIG. 6.

Referring to FIGS. 5 to 8, the electronic device ED according to an embodiment may include an active area AA and a peripheral area NAA. The peripheral area NAA may include a line area WA and a pad area PA. The line area WA of the peripheral area NAA may be adjacent to the active area AA, and the line area WA may be disposed between the active area AA and the pad area PA. Pads PD are disposed in the pad area PA. Pad PD may be electrically connected to corresponding sensing line SL.

Here, a portion of the line area WA in the electronic device ED according to an embodiment may be bent with respect to a virtual bending axis BX extending in the direction parallel to the second directional axis DR2 and folded in a rear direction of the electronic device ED.

An optical layer edge PP-ED may be disposed adjacent to the active area with respect to the bending axis BX. The optical layer edge PP-ED may be spaced apart from an edge DM-ED of the electronic device. For example, a portion of the line area WA may not overlap an optical layer PP (refer to FIG. 11). The optical layer edge PP-ED may represent an edge of a polarizer layer PL (refer to FIG. 11).

The electronic device according to an embodiment may include a display element layer EDL (refer to FIG. 3), an encapsulation layer TFE disposed on the display element layer EDL, a sensor layer TP including a sensing electrode Tx and Rx and a sensing line SL, and a high refraction layer HL disposed on the sensor layer TP.

The sensor layer TP may include a first conductive layer ML1 disposed on the encapsulation layer TFE, a second conductive layer ML2 disposed on the first conductive layer ML1, an inorganic insulation layer IPV disposed between the first conductive layer ML1 and the second conductive layer ML2, and an organic insulation layer OPV disposed between the second conductive layer ML2 and the high refraction layer HL.

The encapsulation layer TFE may include a first inorganic layer ILL an organic layer OL, and a second inorganic layer IL2. The first inorganic layer ILL the organic layer OL, and the second inorganic layer IL2 may protect the display element layer EDL (refer to FIG. 3) from moisture or oxygen and may prevent foreign substances such as dust particles from being introduced. Each of the first inorganic layer IL1 and the second inorganic layer IL2 may include at least one of a silicon nitride, a silicon oxynitride, and a silicon oxide. For example, each of the first inorganic layer IL1 and the second inorganic layer IL2 may include a titanium oxide or an aluminum oxide in an embodiment. However, the embodiments are not limited thereto. The organic layer OL may include an acrylic-based resin. However, the embodiments are not limited thereto.

At least one opening including openings OV-1 and OV-2 may be defined in the organic insulation layer OPV. The openings OV-1 and OV-2 may be disposed in the line area WA. The openings OV-1 and OV-2 extend in a second direction DR2 different from a first direction that is an extension direction of the line. The first direction DR1 may extend from the active area AA to the line area WA.

The inorganic insulation layer IPV may be exposed by the openings OV-1 and OV-2. For example, at least a portion of the organic insulation layer OPV and the second conductive layer ML2 may be removed, and the inorganic insulation layer IPV may be exposed at the openings OV-1 and OV-2.

Referring to FIG. 7, a first opening OV-1 and a second opening OV-2 may be defined in the organic insulation layer OPV. The first opening OV-1 and the second opening OV-2 may be distinguished based on an organic protruding part DM-T disposed therebetween. Here, the organic protruding part DM-T and the organic insulation layer OPV may be the same layer.

In an embodiment, the first opening OV-1 and the second opening OV-2 may be spaced apart from each other. The second opening OV-2 may be disposed closer to the pad area PA than the first opening OV-1.

The inorganic insulation layer IPV may be exposed in the first opening OV-1 and the second opening OV-2, and the exposed inorganic insulation layer IPV may not contact the high refraction layer HL. The second conductive layer ML2 may be overlapped by the organic insulation layer OPV and spaced apart from the high refraction layer HL or removed from the first opening OV-1 and the second opening OV-2 not to contact the high refraction layer HL. Thus, in case that the high refraction layer HL is provided in the electronic device ED according to an embodiment, a high refraction resin may not be diffused along the second conductive layer ML2. In an embodiment, since a conductive material of the second conductive layer ML2 has a high adhesion force with the high refraction resin, the inorganic insulation layer IPV may be exposed by removing the second conductive layer ML2 so that the second conductive layer ML2 is not in contact with the high refraction resin, and thus diffusion of the high refraction resin may be controlled.

The organic protruding part DM-T may function as a dam preventing flow of the high refraction resin even in case that the high refraction resin is diffused to the first opening OV-1.

Figure 9A:
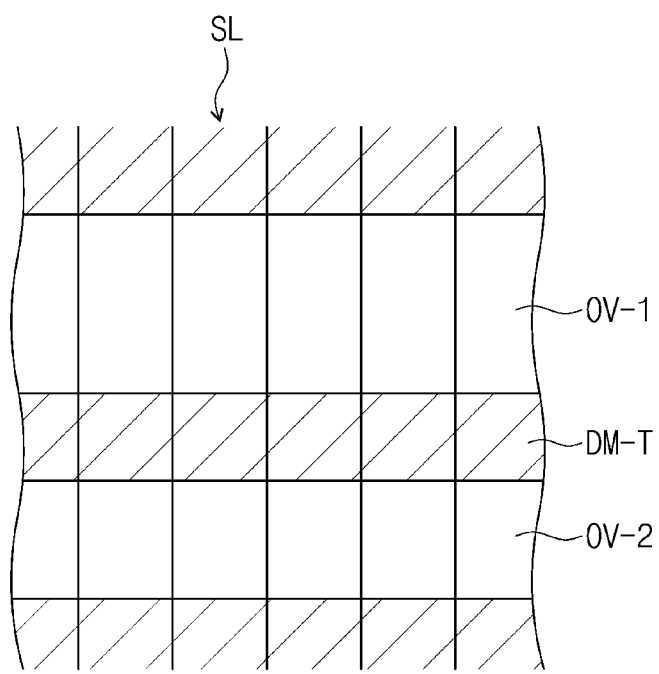
FIG. 9A is a schematic plan view illustrating a portion of the electronic device according to an embodiment.
Figure 9A:
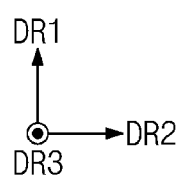
Figure 9B:
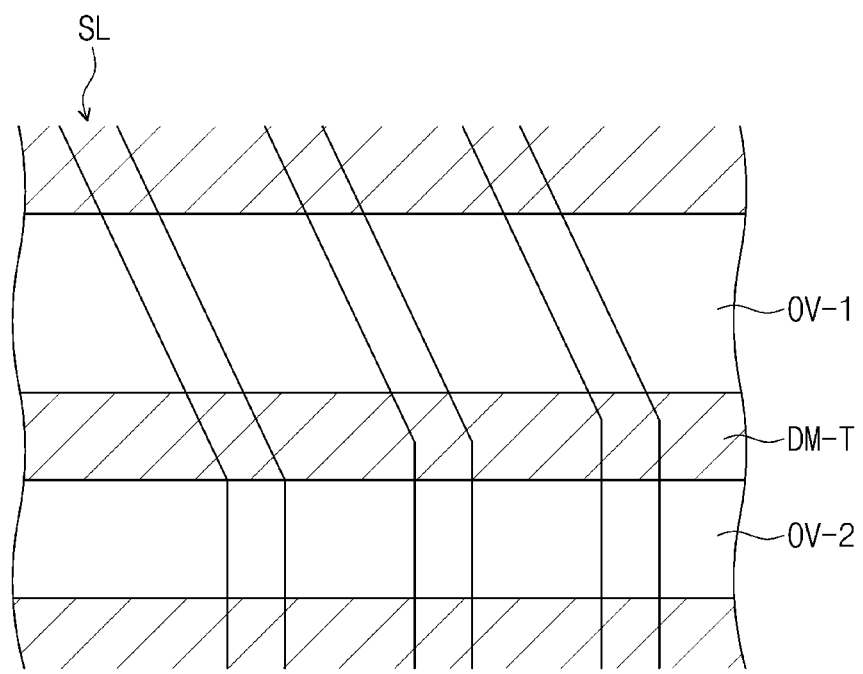
FIG. 9B is a schematic plan view illustrating a portion of the electronic device according to an embodiment.

Here, the second direction DR2 in which the openings OV-1 and OV-2 extend may be perpendicular to the first direction DR1. However, the embodiments are not limited thereto. FIGS. 9A and 9B are schematic plan views illustrating a portion of the line area according to an embodiment. FIGS. 9A and 9B are schematic views illustrating an arrangement relationship between the sensing line SL and the openings OV-1 and OV-2.

Referring to FIG. 9A, each of the openings OV-1 and OV-2 may extend in the second direction DR2 perpendicular to the first direction in which the sensing lines SL extend. Each of the openings OV-1 and OV-2 may have a stripe shape extending in the second direction on a plane defined by the first direction axis DR1 and the second directional axis DR2.

Referring to FIG. 9B, the first opening OV-1 may extend in a diagonal direction with respect to the sensing line SL, and the second opening OV-2 may extend in a direction perpendicular to the sensing line SL. For example, the extension direction of the openings OV-1 and OV-2 may be different from that of the sensing line SL. The extension direction of the openings OV-1 and OV-2 may be perpendicular or diagonal to that of the sensing line SL.

Referring to FIGS. 7 and 8 again, contact holes CH1 and CH2 may be defined in the inorganic insulation layer IPV. The contact holes CH1 and CH2 may be defined at a side and another side of at least one opening OV-1 and OV-2, respectively. The first contact hole CH1 may be defined adjacent to the first opening OV-1 in the inorganic insulation layer IPV, and the second contact hole CH2 may be defined adjacent to the second opening OV-2 in the inorganic insulation layer IPV. The first contact hole CH1 and the second contact hole CH2 may pass through the inorganic insulation layer IPV.

The first conductive layer ML1 and the second conductive layer ML2 may be electrically connected to each other through the first contact hole CH1 and the second contact hole CH2. The first contact hole CH1 and the second contact hole CH2 may be filled by a material of the second conductive layer ML2. Although a first contact hole CH1 defined at a side of the first opening OV-1 and a second contact hole CH2 defined at one side of the second opening OV-2 are illustrated in FIGS. 7 and 8, the embodiments are not limited thereto. Multiple contact holes may be defined at a side of the first opening OV-1, and multiple contact holes may be defined at a side of the second opening OV-2.

The second contact hole CH2 may extend in a direction parallel to the first directional axis DR1. For example, in an embodiment, the second contact hole CH2 may extend lengthwise, parallel to the first directional axis DR1 on a plane, and the first conductive layer ML1 and the second conductive layer ML2 may be electrically connected to each over the entire extending second contact hole CH2. For example, the second contact hole CH2 may be filled by the material of the second conductive layer ML2 in an extension direction of the second contact hole CH2, and the first conductive layer ML1 and the second conductive layer ML2 may electrically contact each other over the entire extending second contact hole CH2.

Referring to FIGS. 7 and 8, the first contact hole CH1 and the second contact hole CH2 may overlap the organic insulation layer OPV and may not overlap the high refraction layer HL.

The electronic device ED according to an embodiment may include dam parts DM1, DM2, and DM3. The dam parts DM1, DM2, and DM3 may be disposed on the line area WA. The dam parts DM1, DM2, and DM3 may be disposed outside the active area AA. The dam parts DM1, DM2, and DM3 may surround at least a portion of the active area AA. Referring to FIGS. 7 and 8, the dam parts DM1, DM2, and DM3 may not overlap the openings OV-1 and OV-2 defined in the organic insulation layer OPV. The dam parts DM1, DM2, and DM3 may not overlap the openings OV-1 and OV-2 and be disposed closer to the active area AA than the openings OV-1 and OV-2.

The dam parts DM1, DM2, and DM3 may include a first dam part DM1, a second dam part DM2, and a third dam part DM3. However, the embodiments are not limited to the number of the dam parts DM1, DM2, and DM3. For example, two dam parts or four or more dam parts may be provided.

The first dam part DM1 may be disposed closest to the active area AA among the dam parts DM1, DM2, and DM3. The first dam part DM1, the second dam part DM2, and the third dam part DM3 may be sequentially arranged in a direction away from the active area AA. The second dam part DM2 may surround at least a portion of the first dam part DM1. The third dam part DM3 may surround at least a portion of the second dam part DM2. The first to third dam parts DM1, DM2, and DM3 may be spaced apart from each other.

Each of the first, second, and third dam parts DM1, DM2, and DM3 may have a structure in which layers are laminated. For example, the first dam part DM1 may include a first base portion DM1-B and a first lamination portion DM1-T laminated (or formed) on the first base portion DM1-B; the second dam part DM2 may include a second base portion DM2-B and a second lamination portion DM2-T laminated on the second base portion DM2-B; and the third dam part DM3 may include a third base portion DM3-B, a third lamination portion DM3-T laminated on the third base portion DM3-B, and a third protruding portion DM3-C laminated on the third lamination portion DM3-T.

The third base portion DM3-B and the fifth insulation layer 50 (refer to FIG. 3) may include the same material and be provided through the same process. The third base portion DM3-B may include an organic material.

The first base portion DM1-B, the second base portion DM2-B, the third lamination portion DM3-T, and the sixth insulation layer 60 (refer to FIG. 3) may include the same material and may be provided through the same process. The first base portion DM1-B, the second base portion DM2-B, the third lamination portion DM3-T, and the pixel defining layer 70 (refer to FIG. 3) may include the same material and be provided through the same process.

In case that an organic monomer resin is supplied to provide the organic layer OL, the first, second, and third dam parts DM1, DM2, and DM3 may serve to prevent the organic monomer from overflowing.

Each of the first, second, and third dam parts DM1, DM2, and DM3 may extend in a direction to cross the sensing lines SL. Referring to FIGS. 7 and 8, as each of the sensing lines SL extends in the first direction DR1, and each of the first, second, and third dam parts DM1, DM2, and DM3 extends in the second direction, the sensing lines SL and the first, second, and third dam parts DM1, DM2, and DM3 may intersect each other.

The sensing lines SL may be disposed on the first, second, and third dam parts DM1, DM2, and DM3 and may have a bent shape at a portion in which the sensing lines SL overlap edges of the first, second, and third dam parts DM1, DM2, and DM3. The sensing lines SL may have a notch shape around the portion in which the sensing lines SL overlap the edges of the first, second, and third dam parts DM1, DM2, and DM3.

The first conductive layer ML1 and the second conductive layer ML2, which form the sensing lines SL, may be electrically connected through contact parts CH-a and CH-c. The contact parts CH-a and CH-c may overlap the first, second, and third dam parts DM1, DM2, and DM3 and may be defined in the inorganic insulation layer IPV. Although the contact part CH-a overlapping the first dam part DM1 and the contact part CH-c overlapping the second dam part DM2 are illustrated in FIGS. 7 and 8, the embodiments are not limited thereto. In other embodiments, two or more contact parts may overlap the dam part, or the contact part may not be defined in a portion overlapping the dam part.

In an embodiment, the line area WA may include a first part WA-a on which the dam parts DM1, DM2, and DM3 are disposed and which is disposed adjacent to the active area AA, a second part WA-b overlapping at least one opening OV-1, and a third part WA-c disposed between the first part WA-a and the second part WA-b.

The inorganic insulation layer IPV, the organic insulation layer OPV, and the high refraction layer HL may overlap each other in the first part WA-a, the inorganic insulation layer IPV, the organic insulation layer OPV, and the high refraction layer HL may not overlap each other in the second part WA-b, and the inorganic insulation layer IPV may overlap the organic insulation layer OPV and may not overlap the high refraction layer HL in the third part WA-c.

The first conductive layer ML1, the inorganic insulation layer IPV, the second conductive layer ML2, the organic insulation layer OPV, and the high refraction layer HL may be sequentially laminated (or formed) in the first part WA-a, and the first conductive layer ML1 and the inorganic insulation layer IPV may be laminated in the second part WA-b. Also, the first conductive layer ML1, the inorganic insulation layer IPV, the second conductive layer ML2, and the organic insulation layer OPV may be sequentially laminated in the third part WA-c.

For example, in the electronic device ED according to an embodiment, the high refraction layer HL may cover or overlap the entire active area AA and be expanded in a direction from the active area AA to the line area WA. The high refraction layer HL may overlap a portion of the line area WA and may not overlap the rest portion of the line area WA, which is adjacent to the pad area PA (refer to FIG. 5).

The high refraction layer HL may overlap the dam parts DM1, DM2, and DM3 and may not overlap the first opening OV-1 in the line area WA. The high refraction layer HL may have a thickness that gradually decreases in a direction from the first dam part DM1 to the third dam part DM3. For example, the high refraction layer HL may have a thickness of about 1.7 mm to about 1.8 mm in the active area AA and a mean thickness of about 22 μm to about 38 μm in the portion overlapping the dam parts DM1, DM2, and DM3. However, the embodiments are not limited thereto.

In the electronic device ED according to an embodiment, an edge HL-ED of the high refraction layer HL may overlap the third dam part DM3. The high refraction layer HL may have a thickness that gradually increases in a direction from above the third dam part DM3 to the active area AA.

Although the edge HL-ED of the high refraction layer HL overlaps a central portion of the third dam part DM3 in this specification, the embodiments are not limited thereto. For example, the edge HL-ED of the high refraction layer HL may overlap the entire third dam part DM3. As another example, the edge HL-ED of the high refraction layer HL may overlap a portion between the third dam part DM3 and the first opening OV-1.

Figure 10:
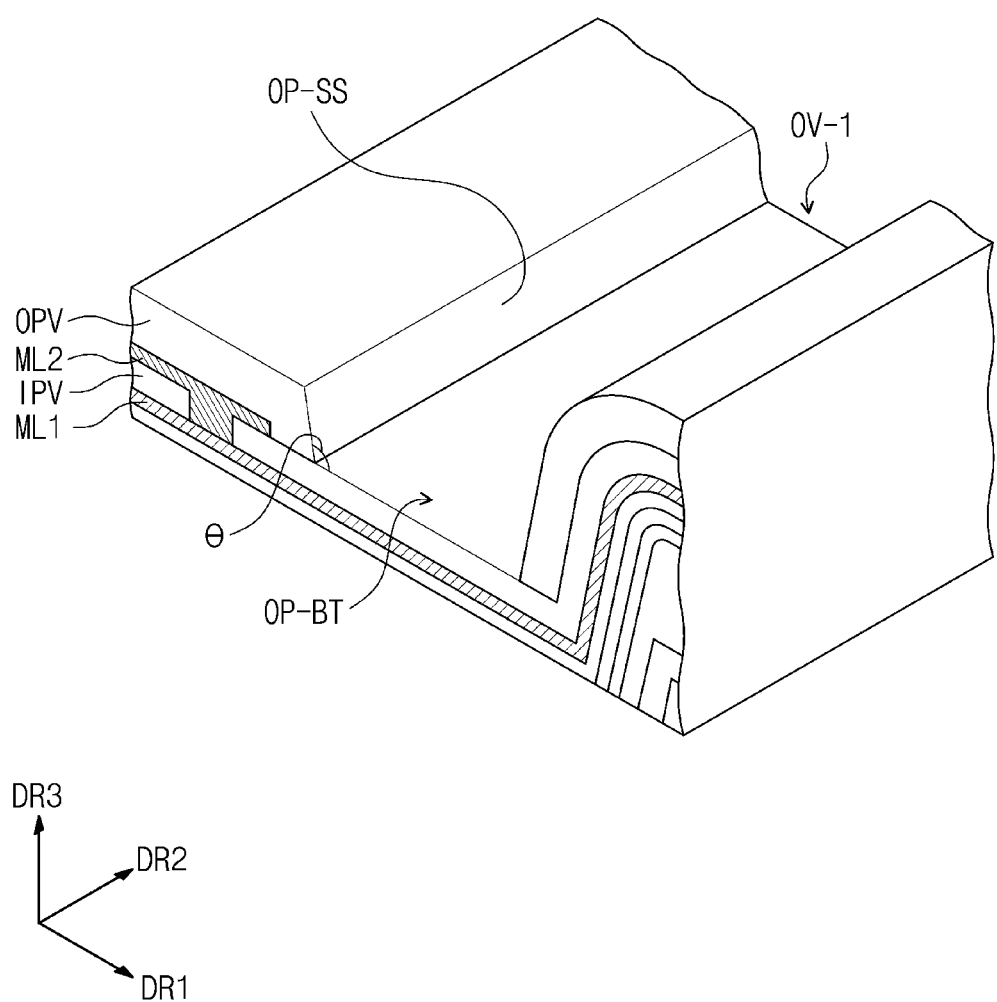
FIG. 10 is a schematic perspective view illustrating a portion of an opening according to an embodiment.

FIG. 10 is a schematic perspective view illustrating the first opening OV-1 in the electronic device according to an embodiment. The first opening OV-1 may include a bottom portion OP-BT defined by the exposed inorganic insulation layer IPV and a side portion OP-SS defined by the organic insulation layer OPV overlapping the second conductive layer ML2. In this embodiment, the bottom portion of the first opening OV-1 may be a partial surface of the exposed inorganic insulation layer IPV, and the side portion of the first opening OV-1 may be a partial side surface of the organic insulation layer OPV. An angle θ of the side surface OP-SS with respect to the bottom portion OP-BT may be greater than about 90°. For example, the angle θ of the side surface OP-SS with respect to the bottom portion OP-BT may be in a range of about 100° to about 110°.

Figure 11:
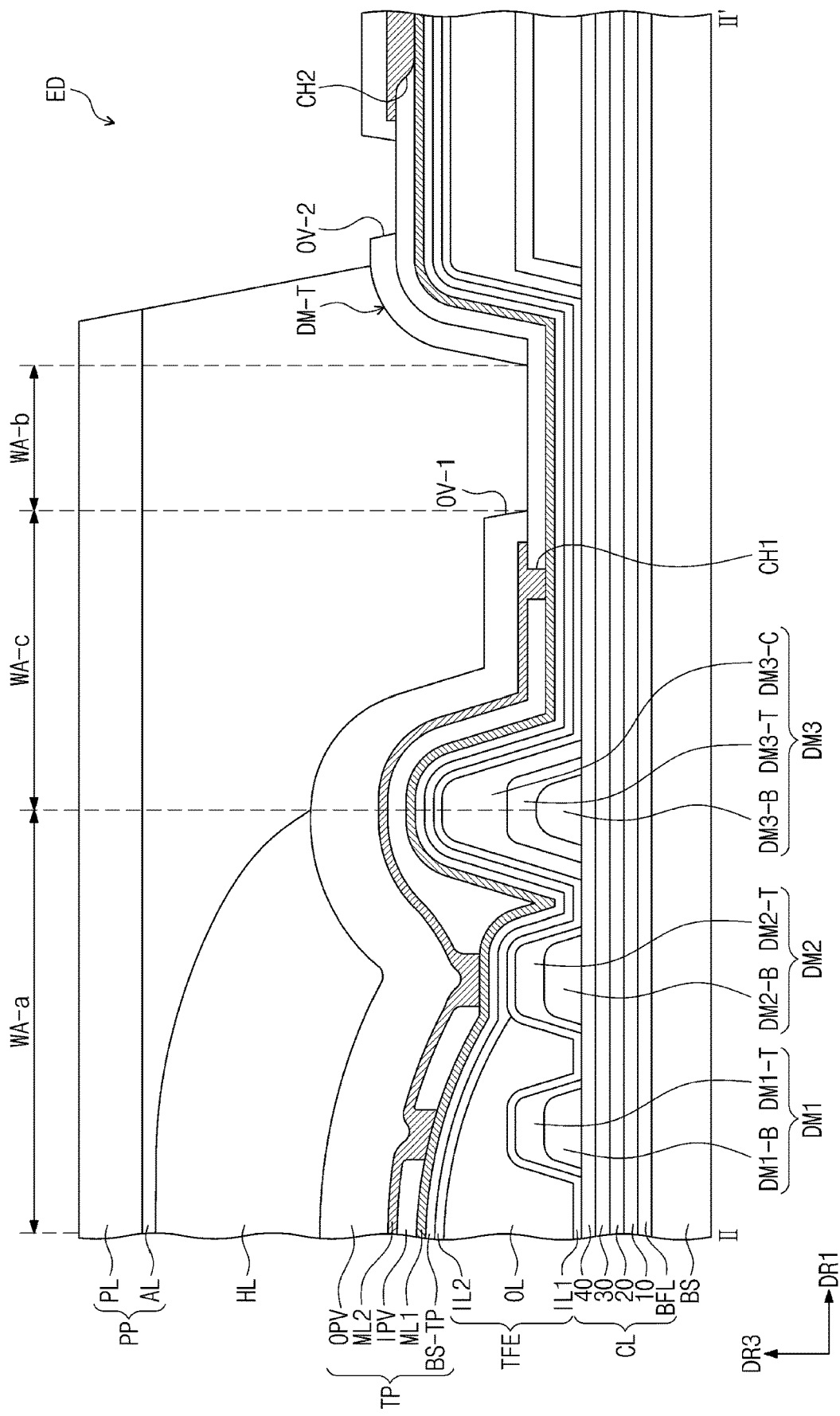
FIG. 11 is a schematic cross-sectional view illustrating a portion of the electronic device according to an embodiment.

FIG. 11 is a schematic cross-sectional view illustrating the electronic device according to an embodiment. The electronic device ED according to an embodiment may further include an optical layer PP disposed on the high refraction layer HL. The optical layer PP may be a polarizing plate including an optical functional layers. The optical layer PP may include an adhesive layer AL and a polarizer layer PL.

The polarizer layer PL may be a film type linear polarizer including an elongated (or stretched) polymer film. For example, the elongated polymer film may be an elongated polyvinylalcohol-based film. The polarizer layer PL may be manufactured by causing a dichroic dye to be adsorbed to the elongated polymer film. For example, the polarizer layer PL may include the elongated polyvinylalcohol-based film and iodine adsorbed thereto. Here, an elongated direction of the polymer film may be an absorption axis of the polarizer layer PL, and a direction perpendicular to the elongated direction may be a transmission axis of the polarizer layer PL. The optical layer PP may further include at least one phase retardation layer (not shown) disposed below the polarizer layer PL. For example, the optical layer PP may include a λ/2 phase retardation layer disposed below the polarizer layer PL and a λ/4 phase retardation layer disposed below the λ/2 phase retardation layer.

The adhesive layer AL may be an optically clear adhesive film (OCA) or an optically clear adhesive resin layer (OCR).

The iodine that is the dichroic dye contained in the polarizer layer PL may move in an ion state through the adhesive layer AL and may be transferred to the sensor layer TP or the like. In case that the ion state iodine contacts the second conductive layer ML2 of the sensor layer TP, the second conductive layer ML2 may corrode, and the sensing sensitivity may be degraded.

In an embodiment, the adhesive layer AL does not directly contact the second conductive layer ML2, and the second conductive layer ML2 may not contact the dichroic dye transferred through the adhesive layer AL. Therefore, corrosion of the second conductive layer ML2 can be prevented, and the sensing sensitivity and sensing performance can be maintained.

Particularly, in the electronic device ED according to an embodiment, as the inorganic insulation layer IPV contacts the adhesive layer AL in the opening OV-1, in which the adhesive layer AL is filled, and the second conductive layer ML2 is removed, degradation in sensing performance caused by adopting the polarizer layer PL may be resolved.

The adhesive layer AL may contact the high refraction layer HL in the first part WA-a of the line area WA, the adhesive layer AL may contact the exposed inorganic insulation layer IPV in the second part WA-b, and the adhesive layer AL may contact the organic insulation layer OPV in the third part WA-c.

Although an edge of the polarizer layer PL overlaps the organic protruding part DM-T in FIG. 11, the embodiments are not limited thereto. For example, the edge of the polarizer layer PL may overlap the second opening OV-2.

An electronic device according to an embodiment in which the second conductive layer ML2 is at least partially removed from the openings, may have a greater line resistance than an electronic device in which the second conductive layer ML2 is not removed. However, the increase in resistance may correspond to a variation within a sensitivity deviation of the sensor layer. Thus, the sensor layer may maintain sensing property even in case that the conductive layer is at least partially removed to expose the inorganic insulation layer as in an embodiment.

An electronic device according to an embodiment includes an opening disposed in the line area that exposes the inorganic insulation layer of the sensor layer. Therefore, diffusion of the high refraction resin may be prevented, and a position of the high refraction layer may be controlled. The electronic device according to an embodiment may minimize performance degradation of the second conductive layer even in case that the second conductive layer contacts the polarizer layer by removing the second conductive layer from the opening to expose the inorganic insulation layer.

Figure 12:
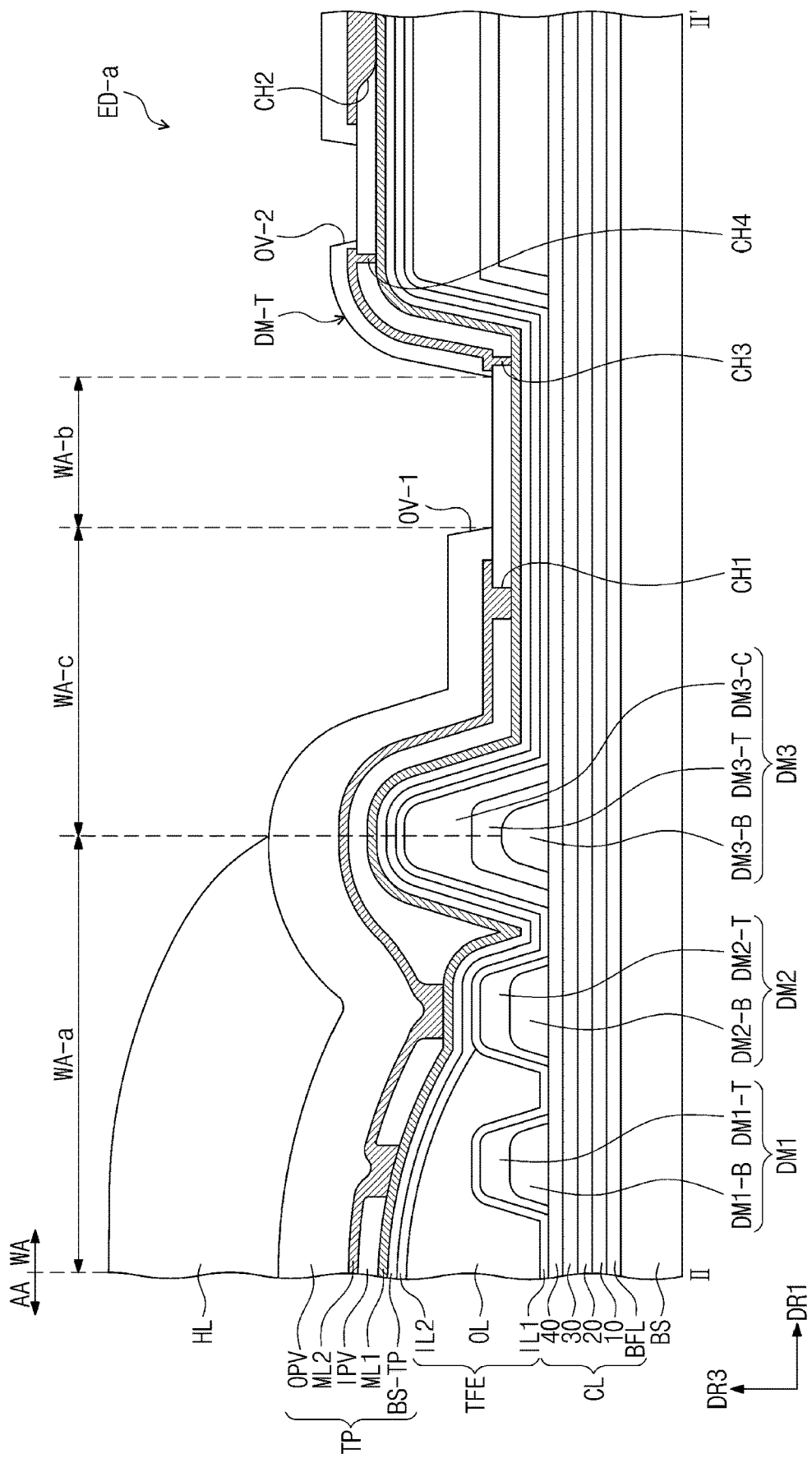
FIG. 12 is a schematic cross-sectional view illustrating a portion of an electronic device according to an embodiment.
Figure 13:
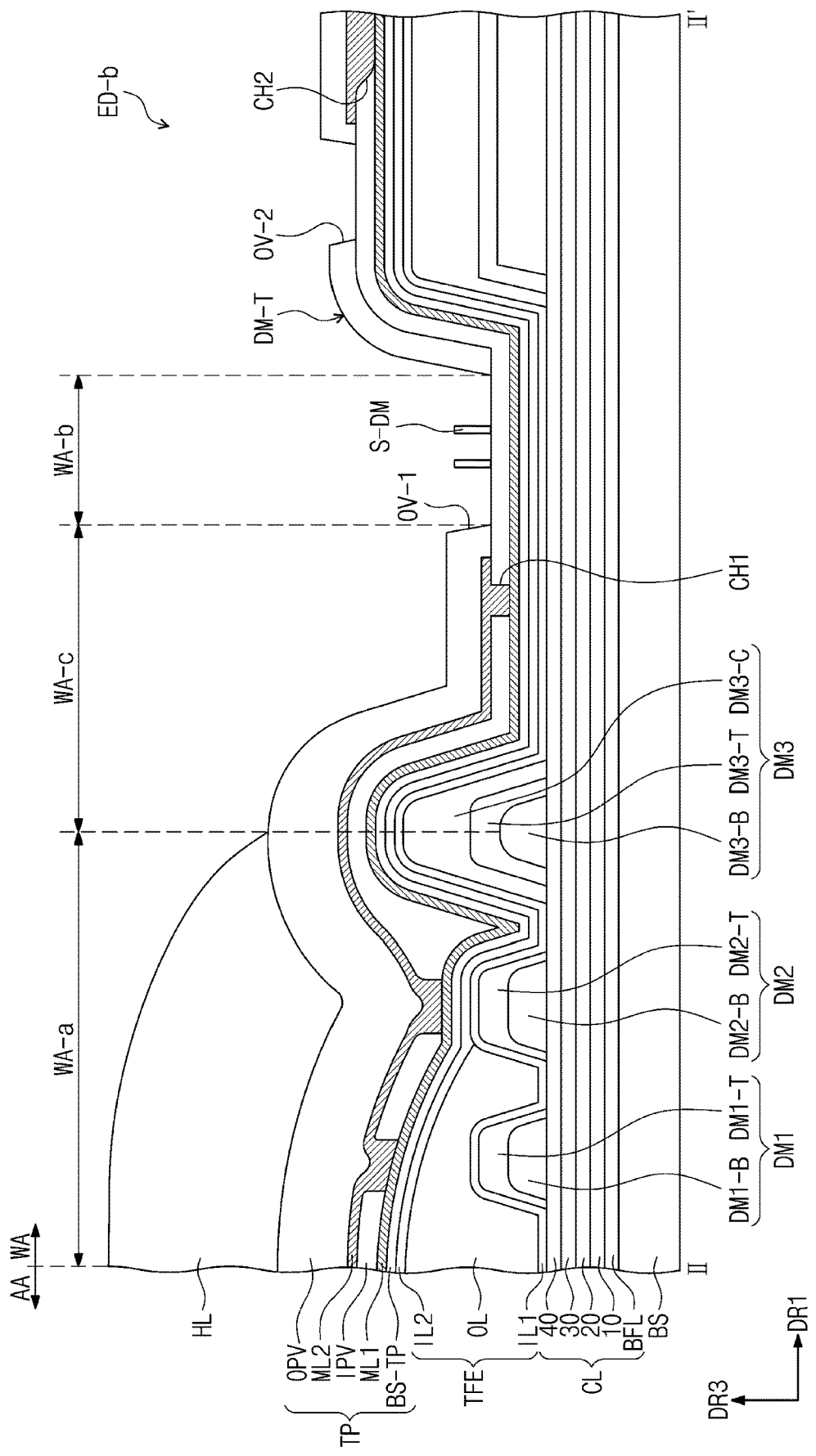
FIG. 13 is a schematic cross-sectional view illustrating a portion of an electronic device according to an embodiment.
Figure 14:
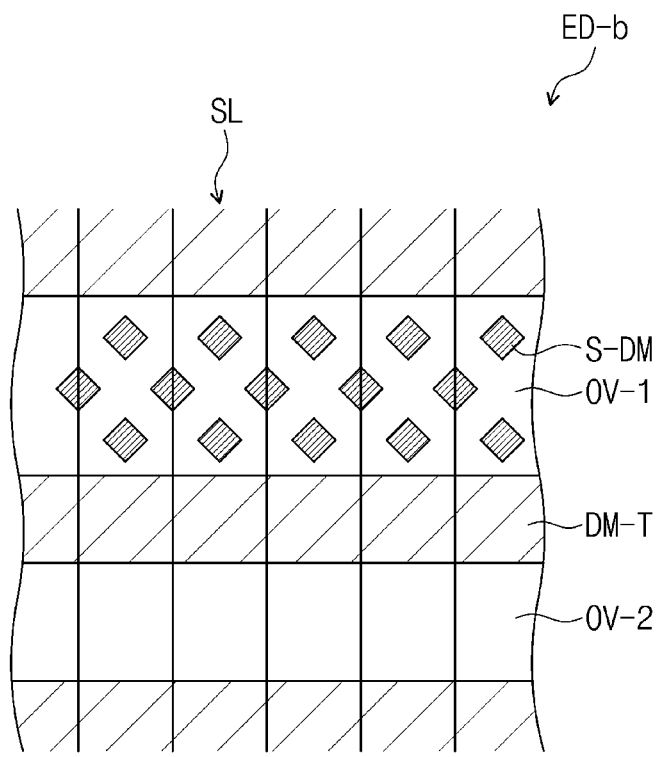
FIG. 14 is a schematic plan view illustrating a portion of the electronic device according to an embodiment.
Figure 14:
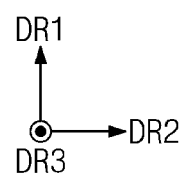

FIGS. 12 to 14 are schematic views illustrating an electronic device according to an embodiment. When the electronic device according to an embodiment is described with reference to FIGS. 12 to 14, features overlapped with those described in FIGS. 1 to 11 will not be described again, and differences will be mainly described.

FIG. 12 is a schematic cross-sectional view illustrating an electronic device according to an embodiment. An electronic device ED-a according to an embodiment in FIG. 12 is different from an embodiment described with reference to FIGS. 6 to 11 in that the organic protruding part DM-T further includes the second conductive layer ML2.

The second conductive layer ML2 in the organic protruding part DM-T may be covered by or overlap the organic insulation layer OPV. At least one contact hole CH3 and CH4 may be defined in the inorganic insulation layer IPV in the organic protruding part DM-T. The first conductive layer ML1 and the second conductive layer ML2 may be electrically connected to each other through the at least one contact hole CH3 and CH4. The at least one contact hole CH3 and CH4 may be filled by the material of the second conductive layer ML2. The electronic device ED-a according to an embodiment in FIG. 12 may reduce a resistance of the sensing line by further including the contact hole CH3 and CH4 electrically connecting the first conductive layer ML1 and the second conductive layer ML2 in the organic protruding part DM-T.

FIG. 13 is a schematic cross-sectional view illustrating an electronic device according to an embodiment, and FIG. 14 is a schematic plan view illustrating the electronic device according to an embodiment.

Referring to FIGS. 13 and 14, an electronic device ED-b according to an embodiment may further include sub-protruding parts S-DM disposed in at least one opening OV-1 and OV-2. The sub-protruding parts S-DM may be spaced apart from each other in the first opening OV-1. Here, the sub-protruding parts S-DM may be made of or include the same material as the organic insulation layer OPV.

Referring to FIG. 14, each of the sub-protruding parts S-DM may have a rectangular shape on a plane. However, the embodiments are not limited thereto. For example, each of the sub-protruding parts S-DM may have a circular, elliptical, or polygonal shape on a plane.

Although the sub-protruding parts S-DM are arranged under a predetermined arrangement in FIGS. 13 and 14, the embodiments are not limited thereto. For example, the sub-protruding parts S-DM may be spaced apart from each other and randomly arranged in the first opening OV-1.

The sub-protruding parts S-DM may function as a dam for preventing the high refraction resin supplied to provide the high refraction layer HL from being diffused from the first opening OV-1 to the second opening OV-2.

The electronic device according to an embodiment may control the position of the high refraction layer by including the opening disposed on the line area to expose the inorganic insulation layer of the sensor layer. The electronic device according to an embodiment may maintain the sensing sensitivity property even in case that the second conductive layer is removed from the opening by electrically connecting the first and second conductive layers through the contact holes defined at the both sides with respect to the opening, respectively. The electronic device according to an embodiment may have many advantageous properties such as reliability by minimizing contact between the dichroic dye of the polarizer layer and the conductive layer of the sensor layer.

The electronic device according to the embodiment may exhibit improved reliability without degradation of the sensing property of the sensor layer by controlling the flow of the high refraction layer as the inorganic insulation layer is exposed in the opening defined in the organic insulation layer.

Although the embodiments of the disclosure have been described, it is understood that the disclosure should not be limited to these embodiments, but various changes and modifications can be made by one ordinary skilled in the art within the spirit and scope of the disclosure as hereinafter claimed.

Hence, the real protective scope of the claimed invention shall be determined by the technical scope of the accompanying claims.

What is claimed is:

1. An electronic device including an active area and a line area disposed adjacent to the active area, the electronic device comprising:
 a display element layer;
 an encapsulation layer disposed on the display element layer;
 a sensor layer comprising:
   a sensing electrode disposed in the active area; and
   a sensing line disposed in the line area, electrically connected with the sensing electrode, and extending in a first direction; and
 a high refraction layer disposed on the sensor layer, wherein
 the sensor layer further comprises:
   a first conductive layer disposed on the encapsulation layer;
   a second conductive layer disposed on the first conductive layer;

an inorganic insulation layer disposed between the first conductive layer and the second conductive layer; and an organic insulation layer disposed between the second conductive layer and the high refraction layer, in the line area, at least one opening is defined in the organic insulation layer, the at least one opening extending in a second direction different from the first direction, and the inorganic insulation layer is exposed by the at least one opening of the organic insulation layer.

2. The electronic device of claim 1, wherein a plurality of contact holes are defined in the inorganic insulation layer, and the plurality of the contact holes comprises a first contact hole and a second contact hole defined at a side and another side of the at least one opening of the organic insulation layer, respectively.

3. The electronic device of claim 2, wherein the first conductive layer and the second conductive layer are electrically connected to each other through the first contact hole and the second contact hole of the plurality of contact holes.

4. The electronic device of claim 2, wherein the first contact hole and the second contact hole of the plurality of contact holes are filled by the second conductive layer.

5. The electronic device of claim 2, wherein the first contact hole and the second contact hole of the plurality of contact holes overlap the organic insulation layer and do not overlap the high refraction layer.

6. The electronic device of claim 1, wherein
the first direction extends from the active area to the line area, and
the second direction is perpendicular to the first direction.

7. The electronic device of claim 1, further comprising a plurality of dam parts disposed in the line area and surrounding at least a portion of the active area,
wherein the plurality of dam parts are disposed adjacent to the active area and do not overlap the at least one opening of the organic insulation layer.

8. The electronic device of claim 7, wherein the line area comprises:
a first part disposed adjacent to the active area where the plurality of dam parts are disposed;
a second part overlapping the at least one opening of the organic insulation layer; and
a third part disposed between the first part and the second part, wherein
the inorganic insulation layer, the organic insulation layer, and the high refraction layer overlap each other in the first part of the line area,
the inorganic insulation layer does not overlap the organic insulation layer and the high refraction layer in the second part of the line area, and
the inorganic insulation layer overlaps the organic insulation layer and is not in overlap with the high refraction layer in the third part of the line area.

9. The electronic device of claim 8, wherein
the first conductive layer, the inorganic insulation layer, the second conductive layer, the organic insulation layer, and the high refraction layer are sequentially formed in the first part of the line area,
the first conductive layer and the inorganic insulation layer are formed in the second part of the line area, and
the first conductive layer, the inorganic insulation layer, the second conductive layer, and the organic insulation layer are sequentially formed in the third part of the line area.

10. The electronic device of claim 9, further comprising:
an adhesive layer disposed on the high refraction layer; and
a polarizer layer disposed on the adhesive layer, wherein
the adhesive layer contacts the high refraction layer in the first part of the line area,
the adhesive layer contacts the exposed inorganic insulation layer in the second part of the line area, and
the adhesive layer contacts the organic insulation layer in the third part of the line area.

11. The electronic device of claim 1, wherein
the at least one opening of the organic insulation layer comprises:
a bottom portion defined by the exposed inorganic insulation layer; and
a side portion defined by the organic insulation layer overlapping the second conductive layer, and
an inclined angle of the side portion with respect to the bottom portion is in a range from about 100° to about 110°.

12. The electronic device of claim 7, wherein
the plurality of dam parts comprise:
a first dam part disposed adjacent to the active area;
a second dam part disposed outside the first dam part; and
a third dam part disposed outside the second dam part, and
the high refraction layer has a thickness that gradually decreases in a direction from the first dam part to the third dam part.

13. The electronic device of claim 12, wherein an edge of the high refraction layer overlaps the third dam part in a plan view.

14. The electronic device of claim 1, wherein the high refraction layer has a refractive index equal to or greater than about 1.6.

15. The electronic device of claim 1, further comprising a plurality of sub-protruding parts spaced apart from each other in the at least one opening of the inorganic insulation layer.

16. The electronic device of claim 15, wherein the plurality of sub-protruding parts and the organic insulation layer include a same material.

17. An electronic device including an active area, a line area disposed adjacent to the active area, and a pad area spaced apart from the active area and disposed adjacent to the line area, the electronic device comprising:
a display element layer;
an encapsulation layer disposed on the display element layer;
a sensor layer comprising:
a sensing electrode disposed in the active area; and
a sensing line disposed in the line area, electrically connected with the sensing electrode, and extending in a first direction; and
a high refraction layer disposed on the sensor layer, wherein
the sensor layer further comprises:
a first conductive layer disposed on the encapsulation layer;
a second conductive layer disposed on the first conductive layer;
an inorganic insulation layer disposed between the first conductive layer and the second conductive layer; and
an organic insulation layer disposed between the second conductive layer and the high refraction layer, in the line area, a first opening and a second opening, each of which extends in a second direction different from the first direction, are defined in the organic insulation layer in the line area, the second opening is disposed closer to the pad area than the first opening, a first contact hole is defined in the inorganic insulation layer in the line area at a side of the first opening in the line area adjacent to the active area, and a second contact hole is defined in the inorganic insulation layer at a side of the second opening adjacent to the pad area.

18. The electronic device of claim 17, wherein the second direction is perpendicular to the first direction, and each of the first opening and the second opening has a stripe shape extending in the second direction in a plan view.

19. The electronic device of claim 17, further comprising:

an adhesive layer disposed on the high refraction layer and filling the first opening of the organic insulation layer; and a polarizer layer disposed on the adhesive layer.

20. The electronic device of claim 19, wherein the adhesive layer contacts the inorganic insulation layer exposed by the first contact hole or the second contact hole, and does not contact the second conductive layer.

* * * * *